(12) United States Patent
Kodama et al.

(10) Patent No.: US 8,851,624 B2
(45) Date of Patent: Oct. 7, 2014

(54) MAINTENANCE LIQUID

(71) Applicant: FUJIFILM Corporation, Tokyo (JP)

(72) Inventors: Kunihiko Kodama, Haibara-gun (JP); Kenichi Kodama, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/030,536

(22) Filed: Sep. 18, 2013

(65) Prior Publication Data

US 2014/0048754 A1 Feb. 20, 2014

Related U.S. Application Data

(62) Division of application No. 13/172,312, filed on Jun. 29, 2011.

(30) Foreign Application Priority Data

Jun. 30, 2010 (JP) .................................. 2010-149850
May 25, 2011 (JP) .................................. 2011-116598

(51) Int. Cl.
*B41J 2/165* (2006.01)
*C11D 3/20* (2006.01)
*C11D 3/00* (2006.01)
*C11D 7/26* (2006.01)
*B82Y 40/00* (2011.01)
*G03F 7/004* (2006.01)
*B82Y 10/00* (2011.01)
*G03F 7/00* (2006.01)

(52) U.S. Cl.
CPC ............ *G03F 7/0045* (2013.01); *C11D 3/2068* (2013.01); *C11D 3/0063* (2013.01); *C11D 7/263* (2013.01); *B82Y 40/00* (2013.01); *C11D 3/2093* (2013.01); *C11D 7/266* (2013.01); *B82Y 10/00* (2013.01); *G03F 7/0002* (2013.01)
USPC ............................. 347/28; 347/22; 134/22.1

(58) Field of Classification Search
None
See application file for complete search history.

(56) References Cited

U.S. PATENT DOCUMENTS

| | | | |
|---|---|---|---|
| 5,259,926 A | 11/1993 | Kuwabara et al. |
| 5,772,905 A | 6/1998 | Chou |
| 5,956,216 A | 9/1999 | Chou |
| 2007/0225185 A1 | 9/2007 | Kasai |
| 2010/0009138 A1 | 1/2010 | Kodama et al. |
| 2010/0126529 A1 | 5/2010 | Seki et al. |
| 2012/0274701 A1 | 11/2012 | Zhou et al. |

FOREIGN PATENT DOCUMENTS

| | | |
|---|---|---|
| JP | 2005-197699 A | 7/2005 |
| JP | 2005-301289 A | 10/2005 |
| JP | 2005-533393 A | 11/2005 |

(Continued)

OTHER PUBLICATIONS

Dervaux et al., J. Polym. Sci.: Part A: Polymer Chemistry, vol. 46, 2008, 1649-1661.*

(Continued)

*Primary Examiner* — Vu A Nguyen
(74) *Attorney, Agent, or Firm* — Sughrue Mion, PLLC

(57) ABSTRACT

Disclosed is a maintenance liquid for property carrying out imprints excellent in patternability. The maintenance liquid for imprints of an ink-jet discharging device comprises a compound comprising an ester group and/or an ether group.

26 Claims, 3 Drawing Sheets

(56) References Cited

FOREIGN PATENT DOCUMENTS

| | | |
|---|---|---|
| JP | 2006-035467 A | 2/2006 |
| JP | 2007-254546 A | 10/2007 |
| JP | 2010-106062 A | 5/2010 |
| WO | 2004/016406 A1 | 2/2004 |

OTHER PUBLICATIONS

M. Colburn, et al., "Step and Flash Imprint Lithography: A New Approach to High-Resolution Patterning," Part of the SPIE Conference on Emerging Lithographic Technologies III, Mar. 1999, pp. 379-389.

Stephen Y. Chou, et al., "Imprint of sub-25 nm vias and trenches in polymers," Appl. Phys. Lett., Nov. 20, 1995, pp. 3114-3116, vol. 67, No. 21.

Ogata et al.; "Journal of Polymer Science Part A-1"; Polymer Chemistry, 9(6); 1971; pp. 1759-1763.

Ethylene Glycol Butyl Ether Acetate, MSDS downloaded from basf. com on Dec. 17, 2012.

Dipropylene Glycol Diacrylate, Product Information downloaded from union-pigment.com on Dec. 17, 2012.

* cited by examiner (a)

Silicon Wafer (b) Ink-jet head 62.4°

Direction of (X)
Head scanning

MAINTENANCE LIQUID

CROSS-REFERENCE TO RELATED APPLICATIONS

The present application is a divisional of U.S. application Ser. No. 13/172,312 filed Jun. 29, 2011, which claims the benefit of priority from Japanese Patent Application No. 149850/2010, filed on Jun. 30, 2010, and Japanese Patent Application No. 116598/2011 filed on May 25, 2011, the contents of which are herein incorporated by reference in their entirety.

BACKGROUND OF THE INVENTION

1. Field of the Invention

The present invention relates to a maintenance liquid of an ink-jet discharging device which is used for applying a photo-curable composition onto a substrate or a mold in photo-imprint methods which saves to transfer a surface shape of a mold on a surface of a substrate.

2. Description of the Related Art

Imprint technology is a development advanced from embossing technology well known in the art of optical disc production, which comprises pressing a mold original with an embossed pattern formed on its surface (this is generally referred to as "mold", "stamper" or "template") against a resist to thereby accurately transfer the micro-pattern onto the resin through mechanical deformation of the resist. In this, when a mold is once prepared, then microstructures such as nanostructures can be repeatedly molded, and therefore, this is economical, and in addition, harmful wastes and discharges from this nanotechnology are reduced. Accordingly these days, this is expected to be applicable to various technical fields.

Two methods of imprint technology have been proposed; one is a thermal imprint method using a thermoplastic resin as the material to be worked (for example, see S. Chou, et al., Appl. Phys. Lett. Vol. 67, 3114 (1995)), and the other is a photoimprint method using a photo-curable composition (for example, see M. Colbun, et al., Proc. SPIE, Vol. 3676, 379 (1999)). In the photoimprint method where a curable composition for photoimprints is photo-cured by photoirradiation through a transparent mold or a transparent substrate, the transferring material does not require heating in pressing it against the mold, and therefore the method enables room-temperature imprinting.

For the imprint methods as above, proposed are applied technologies mentioned below.

In the first technology, the molded pattern itself has a function, and is applied to various elements in nanotechnology and to structural members. Its examples include various micro/nano optical elements and high-density recording media, as well as structural members in optical films, flat panel displays, etc. The second technology is for hybrid-molding of microstructures and nanostructures, or for construction of laminate structures through simple interlayer positioning, and this is applied to production of μ-TAS (micro-total analysis system) and biochips. In the third technology, the formed pattern is used as a mask and is applied to a method of processing a substrate through etching or the like. In these technologies, high-precision positioning is combined with high-density integration; and in place of conventional lithography technology, these technologies are being applied to production of high-density semiconductor integrated circuits and transistors in liquid-crystal displays, and also to magnetic processing for next-generation hard discs referred to as patterned media. Recently, practical realization of imprint methods concerning those applications including the above technologies has become active.

As one example of imprint technology, hereinunder described is an application to production of high-density semiconductor integrated circuits. The recent development in micro-patterning and integration scale enlargement in semiconductor integrated circuits is remarkable, and high-definition photolithography for pattern transfer for realizing the intended micro-patterning is being much promoted and advanced in the art. However, for further requirement for more definite micro-patterning to a higher level, it is now difficult to satisfy all the three of micro-pattern resolution, cost reduction and throughput increase. Regarding this, as a technology of micro-patterning capable of attaining at a low cost, imprint lithography technique, especially nanoimprint lithography (photonanoimprint method) is proposed. For example, U.S. Pat. Nos. 5,772,905 and 5,259,926 disclose a nanoimprint technology of using a silicon wafer as a stamper for transferring a microstructure of at most 25 nm. This application requires micro-patternability on a level of a few tens nm and high-level etching resistance of the micro-pattern functioning as a mask in substrate processing.

In next-generation hard disc drives (HDD), there are proposed technologies of discrete track media and bit patterned media of filling the distance between the adjacent tracks with a non-magnetic material to thereby physically and magnetically separate the tracks. As a method of forming the magnetic or non-magnetic pattern in production of these media, application of nanoimprint technology is proposed. The application also requires micro-patternability on a level of a few tens nm and high-level etching resistance of the micro-pattern functioning as a mask in substrate processing.

In production of a flat display such as liquid-crystal displays (LCD) and plasma display panels (PDP), with the recent tendency toward large-sized substrates for high-definition microprocessing thereon, production of thin-film transistors (TFT) and electrode plates, and application of photo-imprint technology to transparent protective film materials described in JP-A-2005-197699 and JP-A-2005-301289, or to spacers described in JP-A-2005-301289 are being under investigation.

Therefore, photoimprint lithography has become specifically noted these days as an inexpensive lithography technology capable of being substituted for conventional photolithography.

Further, imprint lithography is useful also information of permanent films in optical members such as microelectromechanical systems (MEMS), sensor devices, gratings, relief holograms, etc.; optical films for production of nanodevices, optical devices, flat panel displays, etc.; polarizing elements, thin-film transistors in liquid-crystal displays, organic transistors, color filters, overcoat layers, pillar materials, rib materials for liquid-crystal alignment, microlens arrays, immunoassay chips, DNA separation chips, microreactors, nanobio devices, optical waveguides, optical filters, photonic liquid crystals, reflection-preventing structures (moth-eye) etc.

In the photo-imprint method, a pattern may be obtained by placing a photo-curable composition on a substrate or mold, irradiating light onto the photo-curable composition held between the substrate and the mold so as to cure the photo-curable composition, and then releasing the mold. Various techniques of placing the photo-curable composition onto the substrate have been proposed. Published Japanese Translation of PCT International Publication for Patent Application No. 2005-533393 proposes a method of coating the photocurable composition by an ink-jet device. Since the method of coating making use of the ink-jet device is capable of coating a resist in a discrete manner on the substrate, while specifying positions of landing of resist droplets, so that only a necessary amount of the resist may be placed depending on pattern density, and thereby the thickness of the obtained film may be made uniform.

SUMMARY OF THE INVENTION

The present inventors, however, found out from our investigations that pattern transfer, based on discharging of the photo-curable composition onto the substrate or mold using the ink-jet device, showed only poor pattern transferability when fine patterns, particularly ultra-fine patterns of 50 nm or smaller, were formed.

It is therefore an object of the present invention to solve the above-described problems. That is, an object of the present invention is to provide a technique of reducing defects in the pattern transfer, even in the process of transfer of ultra-fine patterns.

Considering the above-described problems, the present inventors found out from our extensive investigations that maintenance liquid, used for cleaning the ink-jet device, adversely affected the pattern transferability. The inventors also found that defects in the pattern transfer may largely be improved, by adopting a maintenance liquid containing a compound having an ester group and/or an ether group, selected from a large number of maintenance liquids for ink-jet devices, to thereby complete the present invention. It was surprisingly unforeseen that selection of the maintenance liquid might affect the defects in the pattern transfer.

More specifically, the present invention was accomplished by the means below.

(1) A maintenance liquid for an ink-jet device used for a method of forming a pattern, the method including a process of discharging, using the ink-jet device, a photo-curable composition mainly composed of a polymerizable monomer, onto a substrate or a mold having a fine pattern formed thereon and irradiating light onto the photo-curable composition held between the substrate and the mold having a fine pattern formed thereon, the maintenance liquid containing a compound having an ester group and/or an ether group.

(2) The maintenance liquid described in (1), containing a polymerizable monomer.

(3) The maintenance liquid described in (1) or (2), wherein the compound having an ester group and/or an ether group is a polymerizable monomer.

(4) The maintenance liquid described in (2) or (3), wherein at least one species of the polymerizable monomer contained in the maintenance liquid is common, preferably in the range of 90% by mass or more, with at least one species of the polymerizable monomer contained in the photo-curable composition.

(5) The maintenance liquid described in any one of (1) to (4), wherein the photo-curable composition contains a (meth)acrylate.

(6) The maintenance liquid described in any one of (1) to (5), wherein the photo-curable composition contains a (meth)acrylate having an aromatic group and/or an alicyclic hydrocarbon group.

(7) The maintenance liquid described in any one of (1) to (6), wherein the polymerizable monomer contained in the maintenance liquid contains a (meth)acrylate having an aromatic group and/or an alicyclic hydrocarbon group.

(8) The maintenance liquid described in any one of (1) to (7), wherein at least one species of the polymerizable monomer contained in the maintenance liquid, and at least one species of the polymerizable monomer contained in the photo-curable composition respectively contain a (meth)acrylate having an aromatic group and/or an alicyclic hydrocarbon group.

(9) The maintenance liquid described in any one of (1) to (8), wherein 99% by mass or more of the polymerizable monomer contained in the photo-curable composition is a (meth)acrylate.

(10) The maintenance liquid described in any one of (1) to (9), having a viscosity at 25° C. of 50 mPa·s or smaller.

(11) The maintenance liquid described in any one of (1) to (10), containing a compound having both of an ester group and an ether group, or containing both of a compound having an ester group and a compound having an ether group.

(12) The maintenance liquid described in any one of (1) to (11), having a boiling point at 1 atm of 150° C. or higher.

(13) The maintenance liquid described in any one of (1) to (12), containing 50% by mass or more of the compound having an ester group and/or an ether group.

(14) The maintenance liquid described in (1), wherein at least one species of the polymerizable monomer contained in the maintenance liquid, and at least one species of the polymerizable monomer contained in the photo-curable composition respectively contain a (meth)acrylate having an aromatic group and/or an alicyclic hydrocarbon group; and which has a viscosity at 25° C. of 50 mPa·s or smaller.

(15) The maintenance liquid described in (1), wherein at least one species of the polymerizable monomer contained in the maintenance liquid, and at least one species of the polymerizable monomer contained in the photo-curable composition respectively contain (meth)acrylate having an aromatic group and/or alicyclic hydrocarbon group; and which has a viscosity at 25° C. of 50 mPa·s or smaller; and wherein 50% by mass or more of the maintenance liquid is the compound having an ester group and/or an ether group.

(16) The maintenance liquid described in any one of (1) to (15), which essentially consists of the compound having an ester group and/or an ether group and the polymerizable monomer.

(17) The maintenance liquid described in any one of (1) to (15), which essentially consists of the compound having an ester group and/or an ether group and a (meth)acrylate.

(18) The maintenance liquid described in any one of (1) to (15), essentially consisting of a (meth)acrylate having an ester group and/or an ether group.

(19) A method of manufacturing the maintenance liquid described in any one of (1) to (18), the method including a process of mixing components for composing the maintenance liquid, followed by filtration.

(20) A method of cleaning an ink-jet device used for a method of forming a pattern by discharging, using the ink-jet device, a photo-curable composition mainly composed of a polymerizable monomer onto a substrate or a mold having a fine pattern formed thereon, and irradiating light onto the photo-curable composition held between the substrate and the mold having a fine pattern formed thereon, the method using the maintenance liquid described in any one of (1) to (19).

By using the maintenance liquid for an ink-jet device of the present invention, a good pattern may successfully be formed, only with a low incidence of defects in pattern transfer even in a process of transferring ultra-fine patterns.

BRIEF DESCRIPTION OF THE DRAWINGS

FIG. 3A is a schematic drawing illustrating a dot pattern of discharged liquid droplets, and FIG. 3B is a drawing illustrating rotation of a head of the ink-jet device.

Figure 1:
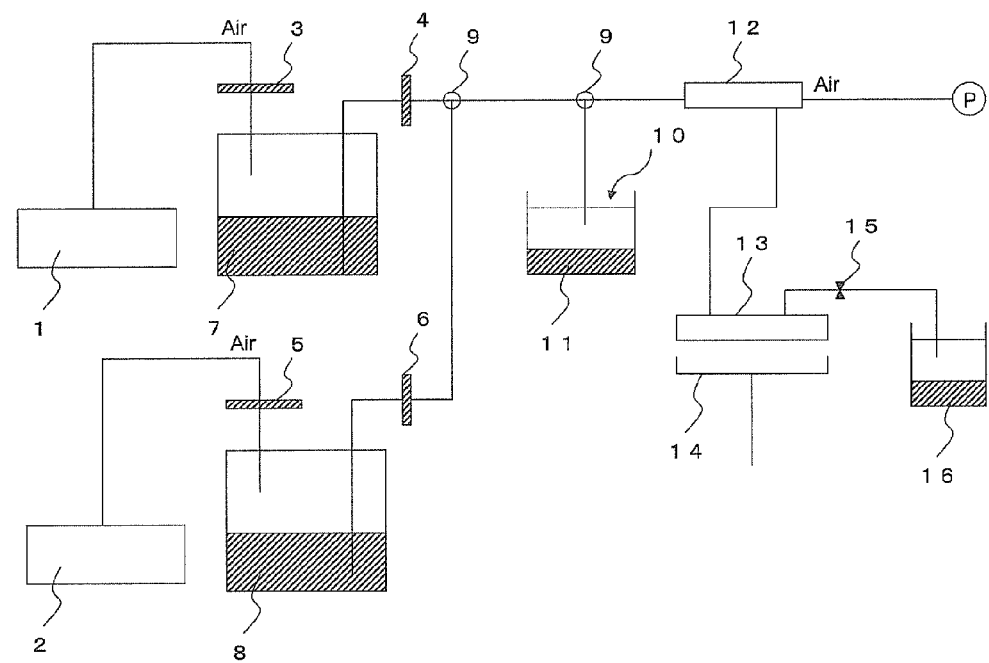
FIG. 1 is a schematic drawing illustrating a configuration of peripheral flow paths of an ink-jet device used in an embodiment of the present invention.

In the drawings, reference numeral 1 stands for a pressure controller on the photo-curable composition side, 2 for a controller on the maintenance liquid side, 3 to 6 for filters, 7 for photo-curable composition tank, 8 for a maintenance liquid tank, 9 for a three-way valve, 10 for a debubbler, 11 for a waste liquid tank, 12 for a deaerating module, 13 for an ink-jetting head, 14 for an ink receiver, 15 for a valve, 16 for a waste liquid tank, 20 for a nozzle surface, 21 for an ink-jetting head, 22 for a maintenance unit, 23 for a waste liquid tray, 24 for an output path, 25 for a coating roller, 26 for a tray, 27 for a coating unit, 28 for a maintenance liquid, 29 for a wiping unit, 30 for a wiping sheet, 31 for a unwinding unit, 32 for a wiping roller unit, 33 for a take-up unit, 34 for an enclosure, 35 for a vertical movement mechanism, 35A for a traveling stage, and 36 for a conveyance roller.

BEST MODE FOR CARRYING OUT THE INVENTION

The contents of the present invention are described in detail hereinunder. The description of the elements described below may be based on a typical embodiment of the present invention, but the present invention is not limited to such an embodiment. In the description, the numerical range expressed by the wording "a number to another number" means the range that falls between the former number indicating the lowermost limit of the range and the latter number indicating the uppermost limit thereof.

In this description, "(meth)acrylate" means acrylate and methacrylate; "(meth)acrylic" means acrylic and methacrylic; "(meth)acryloyl" means acryloyl and methacryloyl. In the present invention, monomer is differentiated from oligomer and polymer, and the monomer indicates a compound having a weight-average molecular weight of at most 2,000. In this description, polymerizable compound means a compound having a polymerizable functional group and may be a monomer, or a polymer. In this description, "functional group" means a group participating in polymerization.

"Imprint" referred to in the present invention is meant to indicate pattern transfer in a size of from 1 nm to 10 mm and preferably meant to indicate pattern transfer in a size of from about 10 nm to 100 micro meter (nanoimprint). In the present invention, when especially a transfer of a pattern size of 100 nm or less, preferably a pattern size of 50 nm or less is carried out, the effect is particularly remarkable.

Regarding the expression of "group (atomic group)" in this description, the expression with no indication of "substituted" or "unsubstituted" includes both "substituted group" and "unsubstituted group". For example, "alkyl group" includes not only an alkyl group not having a substituent (unsubstituted alkyl group) but also an alkyl group having a substituent (substituted alkyl group).

(Maintenance Liquid)

The maintenance liquid of the present invention is a maintenance liquid for an ink-jet device used for a method of forming a pattern. The method includes a process of discharging, using the ink-jet device, a photo-curable composition, mainly composed of polymerizable monomer, onto a substrate or a mold having a fine pattern formed thereon and irradiating light onto the photo-curable composition held between the substrate and the mold having a fine pattern formed thereon. The maintenance liquid contains a compound having an ester group and/or an ether group.

Compound Having Ester Group and/or Ether Group

The compound having an ester group and/or an ether group may have, or may not have, a polymerizable functional group, wherein the compound preferably has the polymerizable functional group from the viewpoint of compatibility with the photo-curable composition.

Preferable examples of the compound having no polymerizable functional group include glycols, glycol monoethers, glycol diethers, glycol monoesters, glycol diesters, and glycol monoether monoesters.

The preferable examples may more specifically be exemplified by glycols such as ethylene glycol, diethylene glycol, triethylene glycol, propylene glycol, and dipropylene glycol; glycol monoethers such as ethylene glycol monobutyl ether, propylene glycol monomethyl ether, propylene glycol monobutyl ether, diethylene glycol monoethyl ether, diethylene glycol monobutyl ether, dipropylene glycol monomethyl ether, dipropylene glycol monoethyl ether, dipropylene glycol monobutyl ether, propylene glycol n-propyl ether, triethylene glycol monomethyl ether, triethylene glycol monoethyl ether, triethylene glycol monobutyl ether, and tripropylene glycol monomethyl ether; glycol diethers such as diethylene glycol diethyl ether, diethylene glycol dibutyl ether, diethylene glycol methyl ethyl ether, tetraethylene glycol dimethyl ether, and tetraethylene glycol diethyl ether; glycol monoether monoesters such as ethylene glycol monomethyl ether acetate, ethylene glycol monoethyl ether acetate, ethylene glycol monobutyl ether acetate, diethylene glycol monomethyl ether acetate, diethylene glycol monoethyl ether acetate, diethylene glycol monobutyl ether acetate, propylene glycol monomethyl ether acetate, dipropylene glycol monomethyl ether acetate, ethylene glycol monomethyl ether propionate, ethylene glycol monoethyl ether propionate, ethylene glycol monobutyl ether propionate, diethylene glycol monomethyl ether propionate, diethylene glycol monoethyl ether propionate, diethylene glycol monobutyl ether propionate, propylene glycol monomethyl ether propionate, dipropylene glycol monomethyl ether propionate, ethylene glycol monomethyl ether butylate, ethylene glycol monoethyl ether butylate, ethylene glycol monobutyl ether butylate, diethylene glycol monomethyl ether butylate, diethylene glycol monoethyl ether butylate, diethylene glycol monobutyl ether butylate, propylene glycol monomethyl ether butylate, and dipropylene glycol monomethyl ether butylate; glycol diesters such as ethylene glycol diacetate, diethylene glycol diacetate, propylene glycol diacetate, dipropylene glycol diacetate, ethylene glycol acetate propionate, ethylene glycol acetate butylate, ethylene glycol propionate butylate, ethylene glycol dipropionate, ethylene glycol acetate butylate, diethylene glycol acetate propionate, diethylene glycol acetate butylate, diethylene glycol propionate butylate, diethylene glycol dipropionate, diethylene glycol acetate dibutylate, propylene glycol acetate propionate, propylene glycol acetate butylate, propylene glycol propionate butylate, propylene glycol dipropionate, propylene glycol acetate butylate, dipropylene glycol acetate propionate, dipropylene glycol acetate butylate, dipropylene glycol propionate butylate, dipropylene glycol dipropionate, and dipropylene glycol acetate dibutylate; cyclic ether compounds such as dioxane, trioxane, furan, tetrahydrofuran, methyltetrahydrofuran, methylfuran, tetrahydropyran, furfural, tetrahydropyran-4-carboxylic acid methyl ester, and tetrahydropyran-4-carboxylic acid ethyl ester; and cyclic ester compounds such as β-butyrolactone, γ-butyrolactone, γ-valerolactone, γ-hexylactone, γ-heptalactone, γ-octalactone, γ-nonalactone, γ-decalactone, γ-undecalactone, δ-valerolactone, δ-hexylactone, δ-heptalactone, δ-octalactone, δ-nonalactone, δ-decalactone, δ-undecalactone, and ε-caprolactone.

Only a single species of the compound having an ester group and/or an ether group may be contained, or two or more species may be contained. While the compound having an ester group and/or an ether group may be good enough to have either one of ester functional group and ether group, the maintenance liquid preferably contain both of ester functional group and ether group. Also use of both of the compound having an ester functional group and the compound having an ether group may be exemplified as another preferable embodiment.

Content of the compound having an ester group and/or an ether group contained in the maintenance liquid of the present invention is preferably 50% by mass or more in total, more preferably 70% by mass or more, and more preferably 90% by mass or more. While the upper limit value is not specifically limited, it is generally 100% by mass or less.

The maintenance liquid preferably contains a polymerizable monomer. By mixing the polymerizable monomer, the maintenance liquid may be more compatible with the polymerizable monomer contained as the major constituent of the photo-curable composition, may be improved in the cleaning power and imprinting performance, and may contribute to improve imprint performance of the ink-jet device. The maintenance liquid of the present invention may contain, as the polymerizable monomer, the compound having an ester group and/or an ether group having a polymerizable group, or may contain other polymerizable monomer besides, or in addition to, such compound. In the present invention, the maintenance liquid preferably contains, as the polymerizable monomer, at least the compound having an ester group and/or an ether group and having the polymerizable group.

While species of the polymerizable monomer is not specifically limited, polymerizable monomers contained in the photo-curable composition described later may be exemplified, which are more specifically exemplified by (meth)acrylate-based compounds, vinyl ether-based compounds, epoxy-based compound and oxetane-based compounds, wherein (meth)acrylate may more preferably be used. In addition, at least one species of the polymerizable monomer contained in the maintenance liquid may be common with at least one species of the polymerizable monomer contained in the photo-curable composition. By virtue of this configuration, the maintenance liquid may be more compatible with the photo-curable composition, and may be improved in the cleaning power. In particular in the present invention, 99% by mass or more of the polymerizable monomer contained in the maintenance liquid is preferably ascribable to (meth)acrylate. If the polymerizable monomer is a compound having an ester group and/or an ether group, it may, or may not, contain the non-polymerizable compound having an ester group and/or an ether group.

It is particularly preferable in the present invention, that both of at least one species of the polymerizable monomer contained in the maintenance liquid, and at least one species of the polymerizable monomer contained in the photo-curable composition are categorized into a group of compounds having similar structure, properties and so forth. Such group of compounds may be exemplified by (Group 1) to (Group 6) below.

It is particularly preferable in the present invention, that both of at least one species of the polymerizable monomer contained in the maintenance liquid, and at least one species of the polymerizable monomer contained in the photo-curable composition are categorized into (Group 1). It is also preferable in the present invention, that at least one species of the polymerizable monomer contained in the maintenance liquid, and at least one species of the polymerizable monomer contained in the photo-curable composition are categorized into (Group 2).

(Group 1) (Meth)acrylates having an aromatic group and/or an alicyclic hydrocarbon group (Group 2) Polymerizable compounds having at lease either one of fluorine atom and silicon atom (Group 3) Compounds having at least two fluorine-containing groups selected from fluoroalkyl group and fluoroalkyl ether group in which at least two of the fluorine-containing groups are separated by a linking group having carbon atoms of 2 or more (Group 4) Polymerizable monomers represented by the following formula;

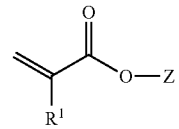

(In the formula, $R^1$ is hydrogen atom, an alkyl group, or a halogen group, Z is a group having an aromatic group or a group having an alicyclic hydrocarbon group, wherein the polymerizable monomer is liquid at 25° C., the viscosity thereof at 25° C. is 500 mPa·s or less.)

(Group 5) Polymerizable monomers represented by the following formula;

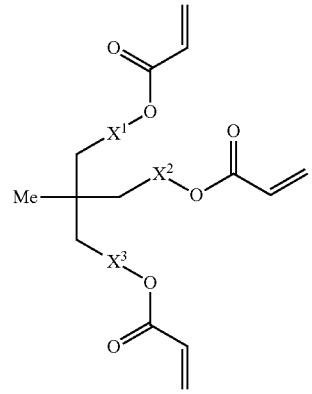

(In the formula, $X^1$ to $X^3$ each independently are a single bond, or a linking group. Me stands for methyl group)

(Group 6) Polymerizable monomers represented by the following formula;

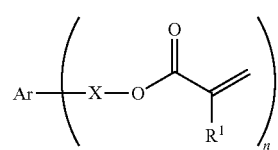

(I)

wherein Ar is an arylene group which may have a substituent, X is a single bond or an organic linking group, $R^1$ is hydrogen atom or methyl group, and n is 2 or 3.

The detail description of the polymerizable monomers is described in the column for the polymerizable monomer contained in the photo-curable composition which is described below.

The total amount of the polymerizable monomer in the maintenance liquid of the present invention is preferably 5 to 100% by mass, more preferably 20 to 100% by mass, further more preferably 40 to 100% by mass. By adding the polymerizable monomer in such a range, the pattern transferability tends to improve.

The maintenance liquid preferably contains a polymerizable monomer as mentioned above, but does not substantially contain a polymer comprising at least one kind of repeating units derived from the polymerizable monomers. Particularly, it is more effective when the polymerizable monomer is bifunctional monomer.

The polymer containing the polymerizable monomer as a repeating unit herein means so-called "impurity polymer", which is inevitably produced during manufacturing and storage of the polymerizable monomer, and during manufacturing and storage of the curable composition for imprints, due to polymerization among molecules of the polymerizable monomer. This is, therefore, totally different from polymer additive such as surfactant.

Now, "substantially free from a polymer" means that a ratio of area (peak ratio) corresponded to components ascribable to the polymerizable monomer, having molecular weight larger than that of the polymerizable monomer, relative to the polymerizable monomer, is generally 1% or smaller, when measured by gel permeation chromatography (GPC) using a differential refractometer (RI detector), preferably 0.5% or smaller, more preferably 0.1% or smaller, and still more preferably below the detection limit.

In gel permeation chromatography (GPC) of the polymerizable monomer (A), even a ultra-trace amount of polymer component which is not detectable by the RI detector, may be detectable in a highly sensitive manner. As a light scattering detector, both of a laser light scattering detector and an evaporative light scattering detector (ELSD) are preferable since they can detect the polymer ingredient at high sensitivity than a RI detector. More preferably is a laser light scattering detector since it can detect the polymer ingredient at higher sensitivity. Since scattering intensity in light scattering increases as particle size increases, so that a polymer having a larger molecular weight may be observed as a larger peak when the laser light scattering detector is used in GPC, and thereby the polymer may be detectable as a large peak in a highly sensitive manner, even if the amount thereof is actually so small as it cannot be detected by the RI detector. As the laser light scattering detector, a multiple angle light scattering detector (MALS) is commercially available.

In a preferable embodiment, a ratio of area (peak ratio) corresponded to components ascribable to the polymerizable monomer, having molecular weight larger than that of the polymerizable monomer, relative to the polymerizable monomer, is generally 50% or smaller, when measured by gel permeation chromatography (GPC) using a laser light scattering detector, preferably 30% or smaller, more preferably 10% or smaller, and particularly preferably below the detection limit.

If two or more species of the polymerizable monomers contained in the maintenance liquid of the present invention, the polymer containing the polymerizable monomer as the repeating units includes homopolymers derived from the individual polymerizable monomers, and copolymer derived from two or more species of polymerizable monomer.

The present inventors found out from our investigations that it is difficult to detect a ultra-trace amount of polymer impurity by GPC, from the polymerizable monomer composition which contains the polymerizable monomer and the polymer containing the polymerizable monomer as a repeating unit, such as those commercially available as the polymerizable monomer. The present inventors also found that even a trace amount of polymer, and therefore cannot be detected by GPC, may adversely affect the imprint pattern. From this point of view, the polymerizable monomer composition contained in the curable composition of the present invention preferably shows a turbidity of 1,000 ppm or below when dissolved in a solvent capable of dissolving therein the polymerizable monomer contained in the curable composition, but incapable of, or nearly incapable of dissolving therein the polymer containing the polymerizable monomer as a repeating unit, so as to adjust the total content of the polymerizable monomer and the polymer containing the polymerizable monomer as a repeating unit, contained in the curable composition, to 10% by mass of the solvent. The turbidity is more preferably 700 ppm or below, still more preferably 500 ppm or below, furthermore preferably 100 ppm, particularly preferably 10 ppm or below, and most preferably 1 ppm or below.

The solvent herein, incapable of, or nearly incapable of dissolving therein the polymer containing the polymerizable monomer as a repeating unit, means a solvent characterized by a solubility of polymer component of typically 1% by mass or below, and preferably contains hydrocarbon solvent (pentane, hexane, heptane, toluene, xylene, benzene, etc.), or alcoholic solvent (methanol, ethanol, 1- or 2-propanol, 1- or 2-butanol, etc.).

The polymer component in the context of the present invention means a component having molecular weight larger than that of the polymerizable monomer, and also contains oligomer. The polymer component preferably has a weight-average molecular weight, measured by GPC, of 10,000 or larger, more preferably 30,000 or larger, still more preferably 50,000 or larger, and most preferably 100,000 or larger. The curable composition may degrade the pattern transferability in imprint, if the polymer component of particularly large molecular weight is contained therein.

While a wide variety of publicly-known methods may be adoptable to the process of removing the polymer containing the polymerizable monomer as a repeating unit, from the polymerizable monomer composition which contains the polymerizable monomer and the polymer containing the polymerizable monomer as a repeating unit, the method preferably includes a step of mixing a solvent capable of dissolving at least one species of the polymerizable monomer, but incapable of, or nearly incapable of dissolving the polymer containing the polymerizable monomer as a repeating unit, with the polymerizable monomer composition; and allowing the polymer to deposit. Preferable examples of the solvent incapable of, or nearly incapable of dissolving the polymer containing the polymerizable monomer composition as a repeating unit include those containing hydrocarbon solvent (pentane, hexane, heptane, toluene, xylene, and benzene, for example), and alcoholic solvent (methanol, ethanol, 1- or 2-propanol, and 1- or 2-butanol, for example). Concentration of the polymerizable monomer composition to be mixed is preferably 1 to 99% by mass, more preferably 3 to 50% by mass, still more preferably 5 to 30% by mass, and most preferably 5 to 20% by mass.

The step of allowing the polymer to deposit is generally followed by removal of the deposited polymer. Method of removal is preferably filtration. Preferable examples of filtering medium include filter paper, filter, silica gel, alumina and celite, among which filter is preferable. Preferable materials for composing the filter include polytetrafluoroethylene, polyethylene, nylon and so forth. Pore size of the filter is preferably 0.005 μm to 10 μm, and more preferably 0.01 μm to 1 μm.

In the maintenance liquid of the present invention, 80% by mass or more of the total composition may preferably be ascribable to a compound having a boiling point of 100° C. or above at 1 atm, from the viewpoint of prevention of deposition of foreign matter as a result of vaporization, or prevention of entrainment of air bubble, more preferably a compound having a boiling point of 120° C. or above at 1 atm, and still more preferably a compound having a boiling point of 150° C. or above at 1 atm. While the upper limit value is not specifically limited, it is generally 500° C. or below.

In addition, the maintenance liquid of the present invention is preferably adjusted to have a dissolved oxygen content of 45 mg/l to 10 mg/l. If the maintenance liquid having a large content of dissolved oxygen were used for cleaning components of the ink-jet device, micro-bubbles may be more likely to produce inside the ink-jet device. If the photo-curable composition were discharged after the cleaning, while leaving the bubbles ascribable to the maintenance liquid contained therein, a normal state of discharging would not be obtained upon pressurizing of the photo-curable composition, since the bubbles would absorb the pressure applied to the photo-curable composition. On the other hand, if the micro-bubbles ascribable to the dissolved oxygen in the maintenance liquid should generate also inside the ink-jet device, oxygen would be introduced into the discharged photo-curable composition so as to inactivate radical active species in the process of polymerization of the polymerizable monomer in the photo-curable composition, and thereby a sufficient amount of radical necessary for the polymerization reaction of the polymerizable monomer would no longer be supplied. As a consequence, a curing reaction of the photo-curable composition goes insufficient. In view of avoiding these problems, the present invention succeeded in effectively suppressing inhibition of polymerization, by adjusting the dissolved oxygen content of the maintenance liquid to 45 mg/l to 10 mg/l.

Viscosity of the maintenance liquid of the present invention at 25° C. is preferably 50 mPa·s or smaller, more preferably 30 mPa·s or smaller, and still more preferably 20 mPa·s or smaller. While the lower limit value is not specifically limited, it is generally adjusted to 1 mPa·s or larger.

The maintenance liquid for an ink-jet device of the present invention preferably has a non-aqueous system, water content of which is preferably 10% by mass or less, and more preferably 5% by mass or less.

The maintenance liquid for an ink-jet device of the present invention may contain various additives. Preferable additives adoptable herein include surfactant, defoaming agent, stabilizer, antioxidant, polymerization inhibitor and so forth. Content of the additives may be 0 to 20% by mass. The maintenance liquid of the present invention may also contain a photo-polymerization initiator, but more preferably contains no photo-polymerization initiator.

In particular, the maintenance liquid of the present invention may preferably be composed of 0 to 95% by mass of the compound having an ester group and/or an ether group, 5 to 100% by mass of (meth)acrylate, and 20% by mass or less of other components.

Method of Ink-Jet Discharging

Since the photo-curable composition is used in the present invention as a liquid to be discharged by an ink-jet process, the viscosity of the photo-curable composition at temperature of discharging (for example, 20 to 80° C., preferably 20 to 60° C.) is preferably adjusted to 5 to 30 mPa·s, and more preferably 5 to 20 mPa·s, taking dischargeability into account. For example, viscosity at 25° C. of the photo-curable composition in the present invention is preferably 5 to 100 mPa·s, and more preferably 5 to 50 mPa·s. In the present invention, the photo-curable composition may appropriately be adjusted in the compositional ratio so as to adjust the viscosity in the above-described ranges.

In other aspects, the method of ink-jet discharging may adopt the description in Japanese Laid-Open Patent Publication No. 2007-254546, without departing from the spirit of the present invention.

In the present invention, the photo-curable composition preferably has a surface tension of 20 to 40 mN/m, more preferably 22 to 38 mN/m, and still more preferably 24 to 36 mN/m, from the viewpoints of dischargeability, and wetting performance on the substrate.

Ink-Jet Device

The ink-jet device adoptable to the present invention may be any of those commercially available, without special limitation. In other words, in the present invention, recording may be accomplished using a commercially available ink-jet device onto a recording medium. The ink-jet device adoptable to the present invention typically includes an ink supply system and a temperature sensor. The ink supply system may be configured typically by a source tank containing the above-described, photo-curable composition adoptable to the present invention, a feed pipe, an ink supply tank placed closely upstream of an ink-jetting head, a filter, and a piezoelectric ink-jetting head. The piezoelectric ink-jetting head may be driven so as to discharge the liquid at a volume of 1 to 100 pl, and more preferably 1 to 20 pl.

As described in the above, the photo-curable composition as an ink may be heated and/or insulated, over the range from the ink supply tank up to the ink-jetting head, since the photo-curable composition to be discharged may preferably be kept at a constant temperature. While method of temperature control is not specifically limited, it may be preferable to provide a plurality of temperature sensors to the individual pipe portions, so as to control flow rate of ink, and to conduct heating control adaptive to environmental temperature. The temperature sensors may be provided in the vicinity of the ink supply tank and the nozzle of the ink-jetting head. It is also preferable that the head unit to be heated is thermally isolated or insulated so as not to be affected by external temperature including the device body. In order to shorten the start-up time of the ink-jet device ascribable to the heating, or to reduce heat energy loss, it is preferable to thermally isolate the heating unit from other portions, and to reduce the heat capacity of the heating unit as a whole.

Next, a method of maintaining the ink-jet device will be described. The maintenance liquid of the present invention is preferably used for cleaning the inside of the ink-jet device, and is more preferably used for cleaning of the head, or used as a filling liquid in the device out of service. The ink-jet device or apart of components thereof may be cleaned using the maintenance liquid of the present invention. Methods of cleaning include a method of wiping the ink-jet device or the components thereof with a cloth or a cleaning blade wetted with the maintenance liquid of the present invention; a method of dipping the ink-jet device or the components thereof into the maintenance liquid of the present invention; a method of coating the maintenance liquid of the present invention onto the ink-jet device or the components thereof, and then bringing an absorbent into contact with the ink-jet device or the components thereof so as to absorb the maintenance liquid; and a method of coating the maintenance liquid of the present invention onto the ink-jet device or the components thereof, and then removing the maintenance liquid by sucking, or blowing, air around the ink-jet device or the components thereof.

If the ink-jet device has a cleaning mechanism for cleaning the head with a cleaning liquid, the head may be cleaned by the cleaning mechanism by feeding the maintenance liquid of the present invention to the cleaning mechanism. When a jetting port of the head is closed with a cap, the cap coated with the maintenance liquid of the present invention may preferably be used.

In addition, portions inside the head and in the vicinity of the nozzle may be cleaned by filling the inner space of the head of the ink-jet device with the maintenance liquid of the present invention, and then by discharging it out through the nozzle. In this case, a pressure of 1 kPa to 100 kPa or around may preferably be applied to the maintenance liquid, and more specifically the maintenance liquid is fed through the ink supply path connected to the head, into the head. The process may also include an operation of discharging the maintenance liquid out from the nozzle by regulating the pressure, or an operation of forcedly sucking up the filled maintenance liquid, typically through a rubber tube, from the nozzle surface so as not to damage the nozzle surface. If the occasion demands, the device may be brought into service, and the maintenance liquid may be discharged from the head, by an operation similar to discharging of ink. Alternatively, a method of cleaning inside of the device (nozzle, head, tube, pump, etc.) by circulating the maintenance liquid, may be exemplified. Still alternatively, the maintenance liquid may be filled in the head, externally applied with ultrasonic vibration so as to accelerate solubilization of solid matters in the head, and then discharged and recovered.

In the present invention, if the ink-jet device is put out of service over several hours, a preferable method of using the ink-jet device is such as filling the maintenance liquid of the present invention in the head of the ink-jet device. By filling the maintenance liquid of the present invention in the head as described in the above, the photo-curable ink may be prevented from being cured, and thereby the head may successfully be suppressed from being clogged. It is also preferable to automatically clean the head using the maintenance liquid, if the discharging has been interrupted over a predetermined length of time or longer (preferably 12 to 168 hours, and more preferably 24 to 36 hours), and to fill the cleaned head with the maintenance liquid. When the ink-jet device is put into service again, the photo-curable ink may be discharged after discharging or recovering the filled maintenance liquid.

(Photo-Curable Composition)

Next, the photo-curable composition of the present invention is described.

The photo-curable composition of the present invention comprises a polymerizable monomer, and, in general, comprises a polymerizable monomer and a photo-polymerization initiator. Kinds of the polymerizable monomer for use in the photo-curable composition of the invention are not specifically limited without diverting the scope of the invention. Examples of the polymerizable monomers include polymerizable unsaturated monomers having from 1 to 6 ethylenic unsaturated bond-having groups, epoxy compounds, oxetane compounds, vinyl ether compounds, styrene derivatives, fluorine atom-containing compounds, propenyl ether or butenyl ether, and the like.

The polymerizable unsaturated monomer having from 1 to 6 ethylenic unsaturated bond-having groups (mono- to hexa-functional polymerizable unsaturated monomer) is described below.

The polymerizable unsaturated monomer having one ethylenic unsaturated bond-having group (mono-functional polymerizable unsaturated monomer) includes concretely methyl(meth)acrylate, ethyl(meth)acrylate, butyl(meth)acrylate, N-vinyl pyrrolidinone, 2-acryloyloxyethyl phthalate, 2-acryloyloxy-2-hydroxyethyl phthalate, 2-acryloyloxyethyl hexahydrophthalate, 2-acryloyloxypropyl phthalate, 2-ethyl-2-butylpropanediol acrylate, 2-ethylhexyl (meth)acrylate, 2-ethylhexylcarbitol (meth)acrylate, 2-hydroxybutyl (meth)acrylate, 2-hydroxyethyl (meth)acrylate, 2-hydroxypropyl (meth)acrylate, 4-hydroxybutyl (meth)acrylate, acrylic acid dimer, benzyl (meth)acrylate, 1- or 2-naphthyl(meth)acrylate, butoxyethyl (meth)acrylate, cetyl (meth)acrylate, ethyleneoxide-modified (hereinafter this may be referred to as "EO") cresol (meth)acrylate, dipropylene glycol (meth)acrylate, ethoxylated phenyl (meth)acrylate, isoamyl (meth)acrylate, cyclopentanyl (meth)acrylate, isobornyl (meth)acrylate, dicyclopentanyl (meth)acrylate, dicyclopentanyloxyethyl (meth)acrylate, isomyristyl (meth)acrylate, lauryl (meth)acrylate, methoxydiproylene glycol (meth)acrylate, methoxytripropylene glycol (meth)acrylate, methoxypolyethylene glycol (meth)acrylate, methoxytriethylene glycol (meth)acrylate, neopentyl glycol benzoate (meth)acrylate, nonylphenoxypolyethylene glycol (meth)acrylate, nonylphenoxypolypropylene glycol (meth)acrylate, octyl (meth)acrylate, paracumylphenoxyethylene glycol (meth)acrylate, epichlorohydrin (hereinafter referred to as "ECH")-modified phenoxyacrylate, phenoxyethyl (meth)acrylate, phenoxydiethylene glycol (meth)acrylate, phenoxyhexaethylene glycol (meth)acrylate, phenoxytetraethylene glycol (meth)acrylate, polyethylene glycol (meth)acrylate, polyethylene glycol-polypropylene glycol (meth)acrylate, polypropylene glycol (meth)acrylate, stearyl (meth)acrylate, EO-modified succinic acid (meth)acrylate, tribromophenyl (meth)acrylate, EO-modified tribromophenyl (meth)acrylate, tridodecyl (meth)acrylate, p-isopropenylphenol, styrene, N-vinyl pyrrolidone, N-vinyl caprolactam.

Of those, especially preferred for use in the present invention are a mono-functional (meth)acrylate having an aromatic structure and/or alicyclic hydrocarbon structure in view of improving dry etching resistance, more preferably a mono-functional (meth)acrylate having an aromatic structure. Specific examples thereof include benzyl (meth)acrylate, 1- or 2-naphthylmethyl (meth)acrylate, dicyclopentanyl (meth)acrylate, dicyclopentanyloxyethyl (meth)acrylate, isobornyl (meth)acrylate, adamantyl (meth)acrylate.

More preferred examples thereof include benzyl (meth)acrylate, 1- or 2-naphthyl(meth)acrylate, or 1- or 2-naphtylmethyl (meth)acrylate.

Of the monofunctional polymerizable monomers having ethylenic unsaturated bond(s), monofunctional (meth)acrylate compound is preferably used in the present invention, from the viewpoint of photo-curability. The monofunctional (meth)acrylate compound may be exemplified by those previously exemplified as the monofunctional polymerizable monomers having ethylenic unsaturated bond(s).

Of those, especially preferred for use in the present invention are a mono-functional (meth)acrylate having an aromatic structure and/or alicyclic hydrocarbon structure in view of improving dry etching resistance, more preferably a monofunctional (meth)acrylate having an aromatic structure. Specific examples thereof include benzyl (meth)acrylate, benzyl (meth)acrylate having a substituent on the benzene ring, wherein examples of preferable substituent include an alkyl group having 1 to 6 carbon atoms, an alkoxy group having 1 to 6 carbon atoms, and cyano group, 1- or 2-naphthylmethyl (meth)acrylate, dicyclopentanyl (meth)acrylate, dicyclopentanyloxyethyl (meth)acrylate, isobornyl (meth)acrylate, adamantyl (meth)acrylate. More preferred examples thereof include benzyl (meth)acrylate having a substituent on the benzene ring, and monofunctional (meth)acrylate compound having a naphthalene structure. Particularly preferred examples thereof include 1- or 2-naphthyl (meth)acrylate and 1- or 2-naphtylmethyl (meth)acrylate.

As the other polymerizable monomer, also preferred is a poly-functional polymerizable unsaturated monomer having two ethylenic unsaturated bond-containing groups.

Preferred examples of the di-functional polymerizable unsaturated monomer having two ethylenic unsaturated bond-containing groups for use in the present invention include diethylene glycol monoethyl ether (meth)acrylate, dimethylol-dicyclopentane di(meth)acrylate, di(meth)acrylated isocyanurate, 1,3-butylene glycol di(meth)acrylate, 1,4-butanediol di(meth)acrylate, EO-modified 1,6-hexanediol di(meth)acrylate, ECH-modified 1,6-hexanediol di(meth) acrylate, allyloxy-polyethylene glycol acrylate, 1,9-nonanediol di(meth)acrylate, EO-modified bisphenol A di(meth)acrylate, PO-modified bisphenol A di(meth)acrylate, modified bisphenol A di(meth)acrylate, EO-modified bisphenol F di(meth)acrylate, ECH-modified hexahydrophthalic acid diacrylate, hydroxypivalic acid neopentyl glycol di(meth)acrylate, neopentyl glycol di(meth)acrylate, EO-modified neopentyl glycol diacrylate, propyleneoxide (hereinafter referred to as "PO")-modified neopentyl glycol diacrylate, caprolactone-modified hydroxypivalate neopentyl glycol, stearic acid-modified pentaerythritol di(meth) acrylate, ECH-modified phthalic acid di(meth)acrylate, poly (ethylene glycol-tetramethylene glycol) di(meth)acrylate, poly(propylene glycol-tetramethylene glycol) di(meth)acrylate, polyester (di) acrylate, polyethylene glycol di(meth) acrylate, polypropylene glycol di(meth)acrylate, ECH-modified propylene glycol di(meth)acrylate, silicone di(meth) acrylate, triethylene glycol di(meth)acrylate, tetraethylene glycol di(meth)acrylate, dimethyloltricyclodecane di(meth) acrylate, neopentyl glycol-modified trimethylolpropane di(meth)acrylate, tripropylene glycol di(meth)acrylate, EO-modified tripropylene glycol di(meth)acrylate, triglycerol di(meth)acrylate, dipropylene glycol di(meth)acrylate, divinylethylene-urea, divinylpropylene-urea, o-, m-, or p-Xylylene di(meth)acrylate, 1,3-adamantane diacrylate, norbornane dimethanol diacrylate.

Of those, especially preferred for use in the present invention are neopentyl glycol di(meth)acrylate, 1,9-nonanediol di(meth)acrylate, tripropylene glycol di(meth)acrylate, tetraethylene glycol di(meth)acrylate, hydroxypivalate neopentyl glycol di(meth)acrylate, polyethylene glycol di(meth)acrylate, o-, m-, or p-, benzene di(meth)acrylate, o-, m-, or p-xylylene di(meth)aclyate, etc.

Examples of the poly-functional polymerizable unsaturated monomer having at least three ethylenic unsaturated bond-having groups include ECH-modified glycerol tri (meth)acrylate, EO-modified glycerol tri(meth)acrylate, PO-modified glycerol tri(meth)acrylate, pentaerythritol triacrylate, EO-modified phosphoric acid triacrylate, trimethylolpropane tri(meth)acrylate, caprolactone-modified trimethylolpropane tri(meth)acrylate, EO-modified trimethylolpropane tri(meth)acrylate, PO-modified trimethylolpropane tri(meth)acrylate, tris(acryloxyethyl) isocyanurate, dipentaerythritol hexa(meth)acrylate, caprolactone-modified dipentaerythritol hexa(meth)acrylate, dipentaerythritol hydroxy-penta(meth)acrylate, alkyl-modified dipentaerythritol penta(meth)acrylate, dipentaerythritol poly(meth)acrylate, alkyl-modified dipentaerythritol tri(meth)acrylate, ditrimethylolpropane tetra(meth)acrylate, pentaerythritol ethoxy-tetra(meth)acrylate, pentaerythritol tetra(meth)acrylate, etc.

Of those, especially preferred for use in the present invention are EO-modified glycerol tri(meth)acrylate, PO-modified glycerol tri(meth)acrylate, trimethylolpropane tri(meth) acrylate, EO-modified trimethylolpropane tri(meth)acrylate, PO-modified trimethylolpropane tri(meth)acrylate, dipentaerythritol hexa(meth)acrylate, pentaerythritol ethoxy-tetra (meth)acrylate, pentaerythritol tetra(meth)acrylate, etc.

Of the multi-functional polymerizable unsaturated monomers having two or more ethylenic unsaturated bonds, multi-functional (meth)acrylate is preferably used from the viewpoint of photo-curability. The multi-functional (meth) acrylate herein is a general term for the bifunctional (meth) acrylate and tri-functional or higher valency of (meth) acrylates. Specific examples of multi-functional (meth) acrylate includes those found among the above-exemplified multi-functional polymerizable unsaturated monomer having two ethylenic unsaturated bonds, and those found among the above-exemplified multi-functional polymerizable unsaturated monomers having three or more ethylenic unsaturated bonds.

The oxirane ring-having compound (epoxy compound) includes, for example, polyglycidyl esters of polybasic acids, polyglycidyl ethers of polyalcohols, polyglycidyl ethers of polyoxyalkylene glycols, polyglycidyl ethers of aromatic polyols, hydrogenated polyglycidyl ethers of aromatic polyols, urethane-polyepoxy compounds, epoxidated polybutadienes, etc. One or more of these compounds may be used either singly or as combined.

The oxirane ring-having compounds preferred for use in the present invention are exemplified by those disclosed at paragraph 0053 of JP-A 2009-73078.

Of those, especially preferred are bisphenol A diglycidyl ether, bisphenol F diglycidyl ether, hydrogenated bisphenol A diglycidyl ether, hydrogenated bisphenol F diglycidyl ether, 1,4-butanediol diglycidyl ether, 1,6-hexanediol diglycidyl ether, glycerin triglycidyl ether, trimethylolpropane triglycidyl ether, neopentyl glycol diglycidyl ether, polyethylene glycol diglycidyl ether, polypropylene glycol diglycidyl ether.

Commercial products favorable for use herein as the glycidyl group-having compound are exemplified by those disclosed at paragraph 0055 of JP-A 2009-73078. One or more of these may be used either singly or as combined.

The production method for the oxirane ring-having compounds is not specifically defined. For example, the compounds may be produced with reference to publications of Lecture of Experimental Chemistry 20, 4th Ed., Organic Synthesis II, p. 213, ff. (Maruzen, 1992); The chemistry of heterocyclic compounds—Small Ring Heterocycles, Part 3, Oxiranes (edited by Alfred Hasfner, John & Wiley and Sons, An Interscience Publication, New York, 1985); Yoshimura, Adhesive, Vol. 29, No. 12, 32, 1985; Yoshimura, Adhesive, Vol. 30, No. 5, 42, 1986; Yoshimura, Adhesive, Vol. 30, No. 7, 42, 1986; JP-A-11-100378, Japanese Patents 2906245 and 2926262. As the polymerizable monomer for use in the present invention, vinyl ether compounds also may be in the composition.

Any known vinyl ether compounds are usable and are exemplified by those disclosed at paragraph 0057 of JP-A 2009-73078.

These vinyl ether compounds can be produced, for example, according to the method described in Stephen. C. Lapin, Polymers Paint Colour Journal, 179 (4237), 321 (1988), concretely through reaction of a polyalcohol or a polyphenol with acetylene, or through reaction of a polyalcohol or a polyphenol with a halogenoalkyl vinyl ether. One or more of these compounds may be used either singly or as combined.

As mentioned above, when at least one kind of the polymerizable monomers contained in the photo-curable composition in the present invention and at least one kind of the polymerizable monomers contained in the maintenance liquid are contained in a common group for compounds, the effect of the invention is more effectively exerted. Hereinunder, the compounds are described below.

(Group 1) (Meth)Acrylates Having an Aromatic Group and/or an Alicyclic Hydrocarbon Group The compounds contained in the group are preferably a (meth)acrylate having an aromatic group, more preferably a (meth)acrylate having a benzene ring and/or a naphthalene ring. Examples thereof include the compounds corresponding to the following (Group 4 to 7).

The content of the polymerizable monomer in the photo-curable composition for use in the invention is not particularly limited. However, it is preferably 10 to 100% by mass, more preferably 30 to 100% by mass, further more preferably 50 to 100% by mass, and still more preferably 70 to 100% by mass, relative to the total content of all the polymerizable compounds in the photo-curable composition.

(Group 2) Polymerizable Compounds Having at Least Either One Of Fluorine Atom and Silicone Atom The polymerizable compound having at least either one of fluorine atom and silicone atom is a compound having at least either one of a functional group comprising fluorine atom, a functional group comprising silicone atom and a functional group comprising both of silicone atom and fluorine atom.

The content of the compound in the photo-curable composition is not limited. However, it is preferably in the range of 0.1 to 100% by mass, more preferably in the range of 0.2 to 50% by mass, furthermore preferably 0.5 to 20% by mass, and still more preferably in the range of 1 to 10% by mass from the viewpoints of improvement of the curaliblity of the composition and decrease of viscosity of the composition.

(A) Polymerizable Compound Having Fluorine Atom

The fluorine atom-containing group owned by the fluorine atom-containing polymerizable monomer is preferably selected from fluoroalkyl group and fluoroalkyl ether group.

The fluoroalkyl group is preferably a fluoroalkyl group having carbon atoms of 2 or more, and a fluoroalkyl group having carbon atoms of 4 or more. The upper limit of the carbon atom number of the fluoroalkyl group is not specifically limited, and is preferably 20 or less, more preferably 8 or less, further more preferably 6 or less. The most preferable is a fluoroalkyl group having carbon atoms of 4 to 6. Preferable examples of fluoroalkyl group include trifluoromethyl group, pentafluoroethyl group, heptafluoropropyl group, hexafluoroisopropyl group, nonafluorobutyl group, tridecafluorohexyl group, and heptadecafluorooctyl group.

The polymerizable compound having at least either one of fluorine atom and silicone atom is preferably a polymerizable compound having trifluoromethyl group. That is, the polymerizable compound preferably has at least one of fluoromethyl group as at least one of fluoroalkyl groups. By virtue of the trifluoromethyl group structure, the effects of the present invention may be expressed only with a small amount of addition (10% by mass or less, for example), so that compatibility with other components may be improved, line edge roughness after dry etching may be improved, and formability of repetitive pattern may be improved.

The fluoroalkyl ether group preferably has a trifluoromethyl group, similarly to the fluoroalkyl group, which may be exemplified by perfluoroethylenoxy group and perfluoropyleneoxy group. Preferable examples are those having a fluoroalkyl ether unit having a trifluoromethyl group such as —(CF(CF$_3$)CF$_2$O)—, and/or those having a trifluoromethyl group at the terminal of the fluoroalkyl ether group.

The total number of fluorine atoms per one molecule, owned by the polymerizable monomer, having at least either one of fluorine atom and silicon atom, is preferably 3 to 60, more preferably 5 to 40, still more preferably 9 to 26.

When the polymerizable monomer having at least either one of fluorine atom is a non-polymer compound, it has a fluorine content, defined below, of 30 to 60%, more preferably 35 to 55%, and still more preferably 35 to 50%. When the polymerizable monomer having at least either one of fluorine atom is a polymer compound, it has a fluorine content, defined below, of 10 to 50%, more preferably 15 to 40%, and still more preferably 20 to 30%. By adjusting the fluorine content in the appropriate range, the curable composition may be improved in the compatibility with other components, less causative of fouling on mold, improved in the line edge roughness after dry etching, and improved in the formability of repetitive pattern transfer. In this patent specification, the fluorine content is given by the equation below:

Fluorine content=[{(Number of fluorine atoms in polymerizable compound)×(atomic weight of fluorine atom)}/(molecular weight of polymerizable compound)]×100

As a preferable example of the fluorine atom-containing of polymerizable monomer, having at least either one of fluorine atom and silicon atom, a compound having a partial structure represented by formula (I) below may be exemplified. By adopting a compound having such partial structure, the curable composition having an excellent formability of pattern, even after repetitive pattern transfer, may be obtained, and temporal stability of the composition may be improved.

Formula (I)

In formula (I), n represents an integer of 1 to 8, and preferably 4 to 6.

One preferable example of the polymerizable monomer having fluorine atom is exemplified by a compound having a partial structure represented by the following formula (II). Of course, the polymerizable monomer having fluorine atom may have both of the partial structure represented by the following formula (I) and the partial structure represented by the following formula (II).

Formula (II)

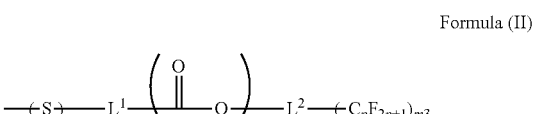

(In the formula (II), $L^1$ represents a single bond, or an alkylene group having carbon atoms of 1 to 8, $L^2$ represents an alkylene group having carbon atoms of 1 to 8, m1 and m2 each represent 0 or 1, wherein at least one of m1 and m2 is 1, m2 is an integer of 1 to 3, p is an integer of 1 to 8, and when m3 is 2 or more, each of —$C_pF_{2p+1}$ may be the same or different to each other.)

The above $L^1$ and $L^2$ each preferably are an alkylene group having carbon atoms of 1 to 4. The alkylene group may have a substituent without diverting the scope of the gist of the present invention. The above m3 is preferably 1 or 2. The above p is preferably an integer of 4 to 6.

Specific examples of the fluorine atom-containing polymerizable monomer used for the composition of the present invention will be enumerated, without restricting the present invention.

As the fluorine atom-containing polymerizable monomer, exemplified are fluorine atom-containing monofunctional polymerizable monomer such as trifluoroethyl (meth)acrylate, pentafluoroethyl (meth)acrylate, (perfluorobutyl)ethyl (meth)acrylate, perfluorobutyl-hydroxypropyl (meth)acrylate, (perfluorohexyl)ethyl (meth)acrylate, octafluoropentyl (meth)acrylate, perfluorooctylethyl (meth)acrylate, tetrafluoropropyl (meth)acrylate, and hexafluoropropyl (meth)acrylate. Also multi-functional polymerizable monomer having two or more polymerizable functional groups, such as those having di(meth)acrylate structure having fluoroalkylene group, exemplified by 2,2,3,3,4,4-hexafluoropentane di(meth)acrylate and 2,2,3,3,4,4,5,5-octafluorohexane di(meth)acrylate, may be preferable examples of the fluorine atom-containing polymerizable monomer.

More preferably compounds are compounds corresponding to (Group 3).

(B) Polymerizable Compound Having Silicone Atom

The structure of the functional group having silicone atom is exemplified by a trialkylsilyl group, a chain-like siloxane structure, a circular siloxane structure, and a cage-type siloxane structure. From the viewpoints of compatibility and mold releasability, it is preferable a trimethylsilyl, or a functional group having a dimethylsiloxane structure The silicon atom-containing polymerizable monomer may be exemplified by 3-tris(trimethylsilyloxy)silylpropyl (meth)acrylate, trimethylsilylethyl (meth)acrylate, polysiloxane having a (meth)acryloyl group, and di(meth)acrulate having a polysiloxane structure.

(Group 3) Compounds Having at Least Two Fluorine-Containing Groups Selected from Fluoroalkyl Group and Fluoroalkyl Ether Group in which at Least Two of the Fluorine-Containing Groups are Separated by a Linking Group Having Carbon Atoms of 2 or More The polymerizable monomer is a compound having at least two fluorine-containing groups selected from fluoroalkyl group and fluoroalkyl ether group in which at lest two of the fluorine-containing groups are separated by a linking group having carbon atoms of 2 or more.

The fluoroalkyl group is preferably a fluoroalkyl group having carton atoms of 2 or more, more preferably 4 or more. The upper limit of the carbon atoms that the fluoroalkyl group has is not specifically limited. However, the upper limit is preferably 20 or less, more preferably 8 or less, further more preferably 6 or less. The most preferable range of the carbon atoms that the fluoroalkyl group has is 4 to 6. At least two of the fluoroalkyl groups preferably have a group having a trifluoromethyl group. The inclusion of more than one trifluoromethyl group structure can exert the effect of the invention even if the amount to be added is less, for example is 10% by mass or less. As a result, the compatibility with other ingredients is improved and line edge roughness is enhanced. From a similar point of view, a compound having three or more of trifluoromethyl groups in one molecular is also preferred. More preferable is a compound having 3 to 9 trifluoromethyl groups, further preferable a compound having 4 to 6 trifluoromethyl group. The compound having three or more of trifluoromethyl groups is preferably a compound having a brunched fluoroalkyl group which has two or more of trifluoromethyl groups in one fluorine-containing group therein. Preferred is a compound having a fluoroalkyl group such as —$CH(CF_3)_2$ group, —$C(CF_3)_3$, —$CCH_3(CF_3)_2CH_3$ group, or the like.

The fluoroalkyl ether group preferably has a trifluoromethyl group, which may be exemplified by perfluoroethylenoxy group and perfluoropropyleneoxy group. Preferable examples are those having a fluoroalkyl ether unit having a trifluoromethyl group such as —$(CF(CF_3)CF_2O)$—, and/or those having a trifluoromethyl group at the terminal of the fluoroalkyl ether group.

The total number of fluorine atoms per one molecule, owned by the polymerizable monomer, having at least either one of fluorine atom and silicon atom, is preferably 6 to 60, more preferably 9 to 40, still more preferably 12 to 40, and particularly preferably 12 to 40.

The polymerizable monomer, having at least either one of fluorine atom and silicon atom, preferably has a fluorine content, defined below, of 30 to 60%, more preferably 35 to 55%, and still more preferably 35 to 50%. By adjusting the fluorine content to the appropriate range, the curable composition may be less causative of fouling on mold, and improved in the line edge roughness after dry etching.

At least of two fluorine-containing groups owned by the polymerizable monomer may preferably be separated by a linking group having at least two carbon atoms. In other words, for the case where the polymerizable monomer has two or more fluorine-containing groups, two such fluorine-containing group are separated by a linking group having two or more carbon atoms. For the case where the polymerizable monomer (A) has three or more fluorine-containing groups, at least two of them are separated by a linking group having two or more carbon atoms, while allowing arbitrary mode of binding for the residual fluorine-containing groups. The linking group having tow or more carbon atoms is a linking group having at least two carbon atoms not substituted by fluorine atoms.

Functional groups possibly contained in the linking group having two or more carbon atoms include groups having at least one of alkylene group, ester group, sulfide group, arylene group, amide group and urethane group, wherein at least ester group and/or sulfide group may preferably be contained. The linking group having two or more carbon atoms is preferably selected from alkylene group, ester group, sulfide group, arylene group, amide group, urethane group and combinations of these groups.

These groups may have a substitutive group, without departing from the spirit of the present invention.

A preferable example of the polymerizable monomer may be exemplified by a compound represented by the formula below.

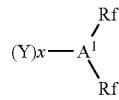

(A1)

In formula, Rf represents a functional group having a fluorine-containing group selected from fluoroalkyl group and fluoroalkyl ether group, and $A^1$ represents a linking group. Y represents a polymerizable functional group, and preferably represents a (meth)acryl ester group, epoxy group, or vinyl ether group. x represents an integer of 1 to 4, and preferably represents 1 or 2. If x is 2 or larger, the individual (Y)s may be same with, or different from each other.

$A^1$ preferably represents a linking group having an alkylene group and/or arylene group, and may additionally have a linking group which contains a hetero atom. The linking group having a hetero atom may be exemplified by —O—, —C(=O)O—, —S—, —C(=O)—, and —NH—. While the groups may have a substituent without departing from the spirit of the present invention, no substitution is more preferable. $A^1$ is preferably a linking group having 2 to 50 carbon atoms, and more preferably a linking group having 4 to 15 carbon atoms.

Preferable examples of the polymerizable monomer may be given by compounds having a partial structure represented by formula below. By adopting the compounds having this fort of partial structure, the pattern formability may be improved, and temporal stability of the composition may be improved.

In formula (I), n represents an integer of 1 to 8, preferably 4 to 6.

Other preferable examples of the polymerizable monomer may be given by compounds having a partial structure represented by formula (II) below. Of course, the polymerizable monomer may have both of partial structures represented by formulae (I) and (II).

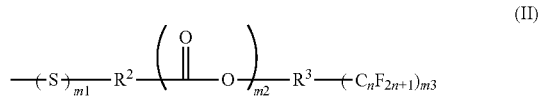

In formula (II), each of $R^2$ and $R^3$ independently represents a $C_{1-8}$ alkylene group, and preferably a $C_{1-4}$ alkylene group. The alkylene group may have a substituent, without departing from the spirit of the present invention.

Each of m1 and m2 independently represents 0 or 1, where at least either one of m1 and m2 is 1. m3 represents an integer of 1 to 3, preferably 1 or 2. n represents an integer of 1 to 8, preferably 4 to 6. If m3 is 2 or larger, the individual (—$C_nF_{2n+1}$)s may be same with, or different from each other.

The polymerizable monomer (A) is preferably a polymerizable monomer represented by formula (III) below.

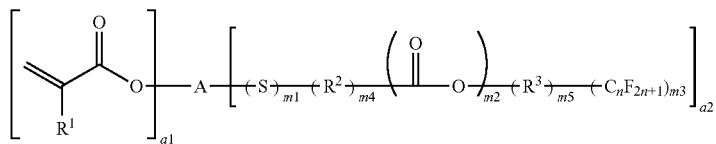

(In formula (III), $R^1$ represents a hydrogen atom, alkyl group, halogen atom or cyano group, A represents an (a1+a2)-valent linking group, and a1 represents an integer of 1 to 6. a2 represents an integer of 2 to 6, and each of $R^2$ and $R^3$ independently represents a alkylene group having 1 to 8 carbon atoms. Each of m1 and m2 independently represents 0 or 1, and at least either one of m1 and m2 is 1. m3 represents an integer of 1 to 3. Each of m4 and m5 independently represents 0 or 1, at least either one of m4 and m5 is 1, and m4 represents 1 if both of m1 and m2 are 1. n represents an integer of 1 to 8.)

$R^1$ represents a hydrogen atom, alkyl group, halogen atom or cyano group, preferably hydrogen atom or alkyl group, more preferably hydrogen atom or methyl group, and still more preferably hydrogen atom.

"A" represents an (a1+a2)-valent linking group, preferably a linking group which has an alkylene group and/or arylene group, and may additionally have a hetero atom-containing linking group. The hetero atom-containing linking group may be exemplified by —O—, —C(=O)O—, —S—, —C(=O)—, and —NH—. These groups may have substituents without departing from the scope of the present invention, but more preferably have no substituents. "A" is preferably $C_{2-50}$ group, and more preferably $C_{4-15}$ group.

$R^2$, $R^3$, m1, m2, m3 and n are similarly defined as those in formula (II), also with the same preferable ranges.

a1 represents an integer of 1 to 6, preferably 1 to 3, and more preferably 1 or 2.

a2 represents an integer of 2 to 6, preferably 2 or 3, and more preferably 2.

If a1 is 2, the individual (A)s may be same with, or different from each other.

If a2 is 2 or larger, each of $R^2$, $R^3$, m1, m2, m3, m4, m5 and n may be same with, or different from each other.

Molecular weight of the polymerizable monomer used in the present invention is preferably 500 to 2,000, more preferably 600 to 1,500, and further more preferably 600 to 1,200.

Specific examples of the polymerizable monomer used for the curable composition of the present invention will be given below, without restricting the present invention. $R^1$ in the formulae below represents any of hydrogen atom, alkyl group, halogen atom and cyano group.

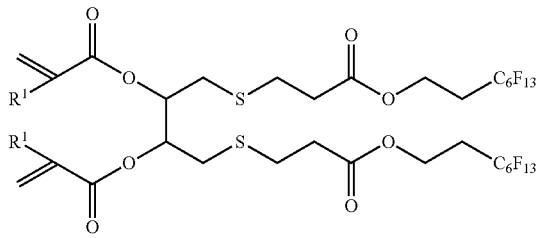

-continued

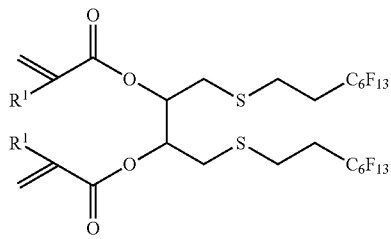

-continued
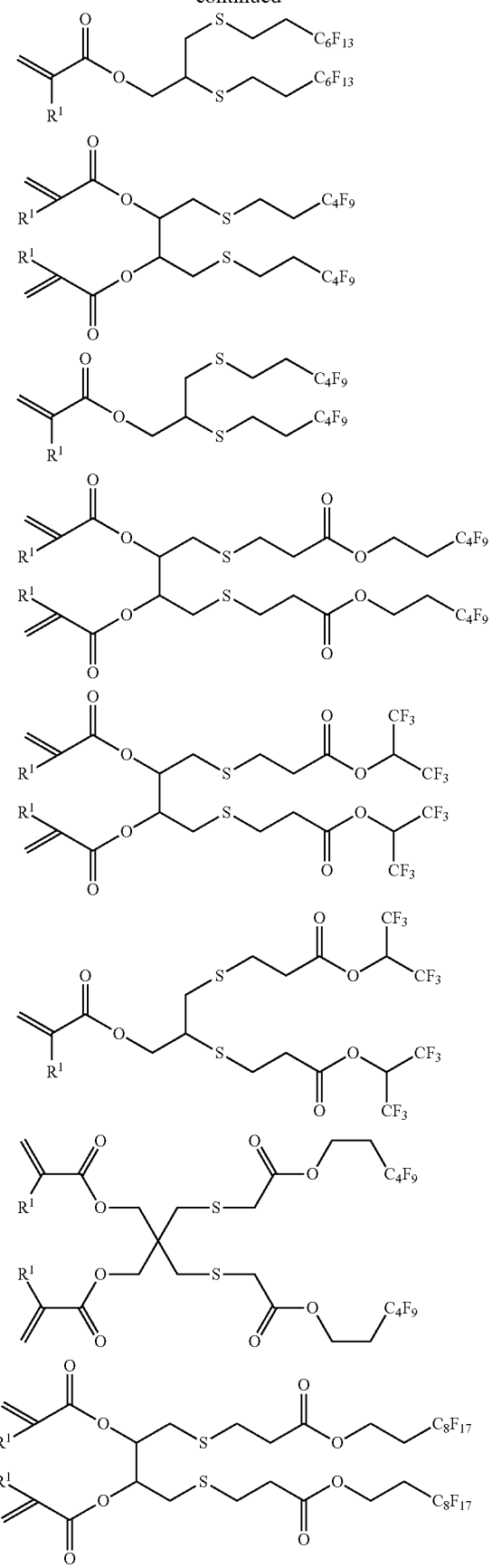
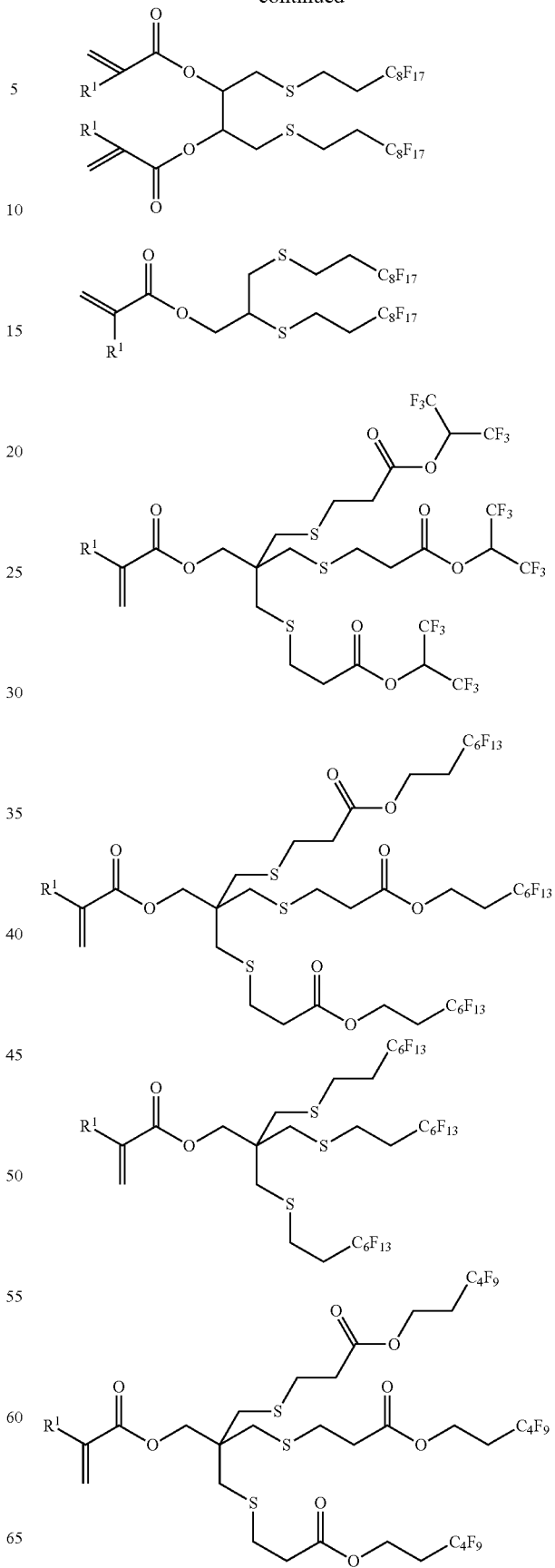

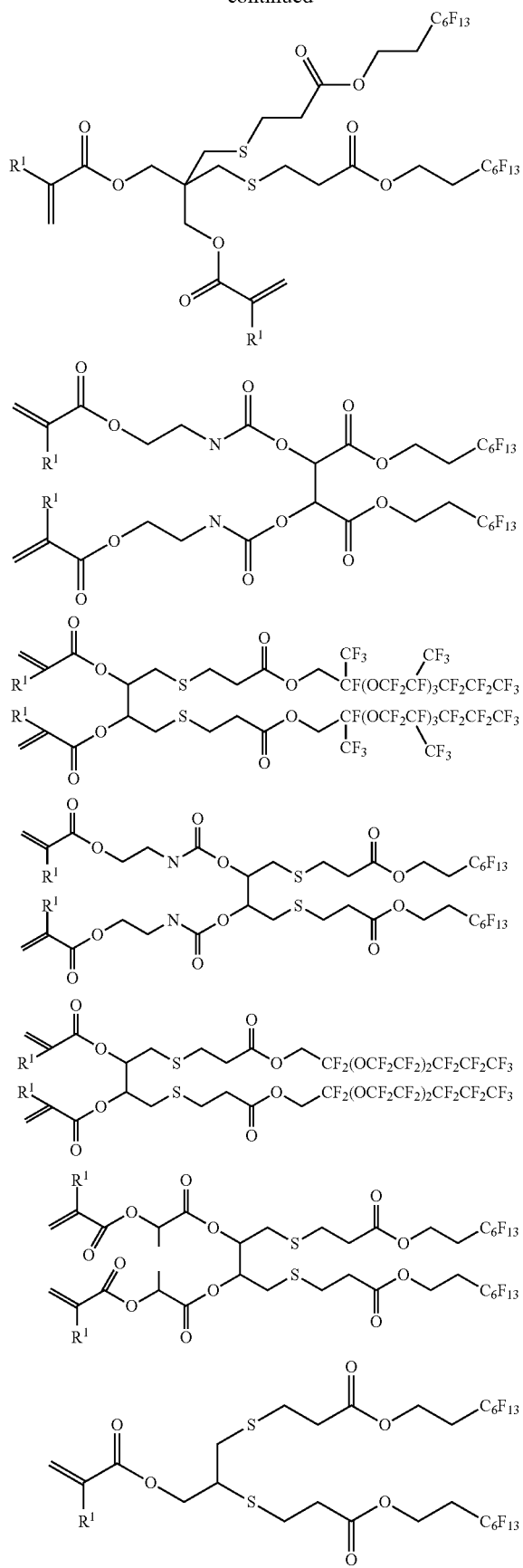

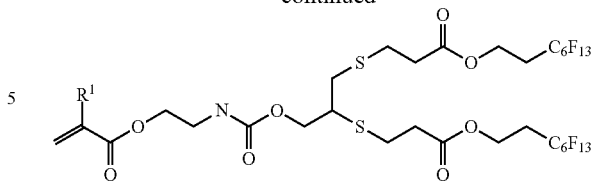

(Group 4) Polymerizable monomers represented by the following formula;

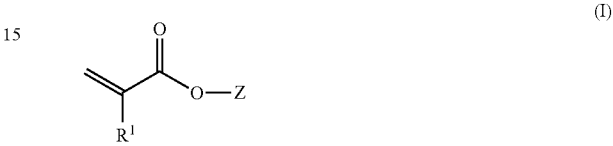

(I)

(In the formula, $R^1$ is hydrogen atom, an alkyl group, or a halogen group, Z is a group having an aromatic group or a group having an alicyclic hydrocarbon group, wherein the polymerizable monomer is liquid at 25° C., the viscosity thereof at 25° C. is 500 mPa·s or less.)

$R^1$ is preferably a hydrogen atom, or an alkyl group, more preferably a hydrogen atom, or a methyl group, further more preferably a hydrogen atom from the viewpoint of the curability of the composition. Examples of the halogen atom include fluorine atom, chlorine atom, bromine atom, and iodine atom, and preferred is fluorine atom.

Z is an aralkyl group which may have a substituent, an aryl group which may have a substituent, or a group in which those groups are bonded to each other via a linking group. The linking group may include a hetero atom. The linking group is preferably —$CH_2$—, —O—, —C(=O)—, —S—, or a combination thereof. The aromatic group contained in Z is preferably a phenyl group or a naphthyl group, and the aromatic group more preferably contains only a phenyl group as an aromatic group. Compared with polycyclic aromatic groups and hetero aromatic groups, a compound containing only a phenyl group as an aromatic group has lower viscosity and better patternability, and can control failure of particle. The molecular weight of Z is preferably 100 to 300, more preferably 120 to 250.

From the viewpoints of the viscosity of the polymerizable monomer and the dry etching resistance, the number of the polymerizable groups and the number of the aromatic groups contained in a polymerizable monomer preferably satisfies as follows:

the number of the polymerizable groups is equal or small to the number of the aromatic groups In such a case, a condensed aromatic ring such as naphthalene is regarded as having one aromatic group, and two aromatic rings which bond to each other through a bond such as biphenyl is regarded as having two aromatic groups.

When the polymerizable monomer is liquid at 25P, the viscosity thereof is preferably 2 to 500 mPa·s at 25° C., more preferably 3 to 200 mPa·s, further more preferably 3 to 100 mPa·s. The polymerizable monomer is preferably liquid at 25° C., or solid having a melting point of 60° C. or less, more preferably liquid at 25° C.

Z preferably represents —$Z^1$—$Z^2$. $Z^1$ is a single bond, or a hydrocarbon group which may have a linking group containing a hetero atom in the chain thereof. $Z^2$ is an aromatic group which may have a substituent. $Z^2$ has a molecular weight of 90 or more.

$Z^1$ is preferably a single bond, or an alkylene group which may have a linking group containing a hetero atom in the chain of the linking group. $Z^1$ is more preferably an alkylene group not having a linking group containing a hetero atom in the chain thereof, more preferably a methylene group, or an ethylene group. Examples of the linking group containing a hetero atom include —O—, —C(=O)—, —S—, and a combination of an alkylene group and at least one of —O—, —C(=O)— and —S—. The number of the carbon atoms of $Z^1$ is preferably 1 to 3.

$Z^2$ is an aromatic group having a substituent having a molecular weight of 15 or more. The aromatic group contained in $Z^2$ is exemplified by a phenyl group and a naphthyl group, preferably a phenyl group having a substituent having a molecular weight of 15 or more. $Z^2$ is preferably composed of an aromatic group having a single ring.

$Z^2$ is also preferably a group in which two or more aromatic groups directly bond to each other, or a group in which two or more aromatic groups bond to each other via a linking group. The linking group is preferably —CH$_2$—, —O—, —C(=O)—, —S—, or a combination thereof.

Examples of a substituent which the aromatic group may have include a halogen atom (fluorine atom, chlorine atom, bromo atom, iodine atom), a linear, a branched, or a cyclic alkyl group, an alkenyl group, an alkynyl group, an aryl group, an acyl group, an alkoxycarbonyl group, an aryloxycarbonyl group, a carbamoyl group, a cyano group, a carboxyl group, a hydroxy group, an alkoxy group, an aryloxy group, an alkylthio group, an arylthio group, a heterocyclic-oxy group, an acyloxy group, an amino group, a nitro group, a hydrazino group, a heterocyclic group. A group which is substituted with those groups is also preferred.

The amount of the compound represented by the formula (I) to be added in the composition is preferably 10 to 100% by mass, more preferably 20 to 100% by mass, further more preferably 30 to 80% by mass.

The compound represented by the formula is also preferably represented by the following formula (II);

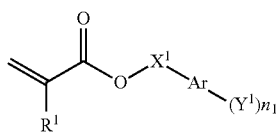

(II)

(In the formula (II), $R^1$ represents a hydrogen atom, an alkyl group, or a halogen atom; $X^1$ is a single bond, or a hydrocarbon group which may have a linking group containing a hetero atom in the chain of the linking group; Y represents a substituent having a molecular weight of 15 or more; n1 represents an integer of 1 to 3; and Ar is an aromatic linking group, preferably a phenylene group, and an aromatic group.)

$R^1$ is the same as $R^1$ in the above formula (I) and the preferable range thereof is the same as $R^1$ in the above formula (I).

$X^1$ is the same as $Z^1$ in the above and the preferable range thereof is the same as $Z^1$ in the above. $Y^1$ is a substituent having a molecular weight of 15 or more. Examples of $Y^1$ include an alkyl group, an alkoxy group, an aryloxy group, an alkenyl group, an aralkyl group, an acyl group, an alkoxycarbonyl group, an alkylthio group, an arylthio group, a halogen atom and a cyano group. Those substituents may have a substituent.

When n1 is 0, $X^1$ is preferably an alkylene group having carbon atoms of 2 or s, and when n1 is 2, $X^1$ is preferably a single bond, or a hydrocarbon group having 1 carbon atom.

In particular, the more preferred embodiment is that n1 is 1 and $X^1$ is an alkylene group having 1 to 3 carbon atoms.

The compound represented by the formula (II) is more preferably represented by the following formula (III);

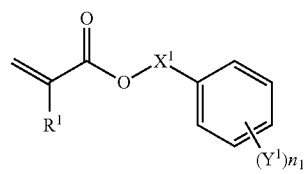

(III)

(In the formula (III), $R^1$ represents a hydrogen atom, an alkyl group, or a halogen atom; $X^1$ is a single bond, or a hydrocarbon group which may have a linking group containing a hetero atom in the chain of the linking group; $Y^1$ represents a substituent having a molecular weight of 15 or more; n1 represents an integer of 1 to 3. When n1 is 0, $X^1$ is a hydrocarbon group having 2 carbon atoms.)

$R^1$ is the same as $R^1$ in the above formula and the preferable range thereof is the same as $R^1$ in the above formula.

$X^1$ is the same as $Z^1$ in the above formula and the preferable range thereof is the same as $Z^1$ in the above formula.

$Y^1$ is the same as $Y^1$ in the above formula (II) and the preferable range thereof is the same as $Y^1$ in the above formula (II).

n1 is the same as n1 in the formula (II) and the preferable range thereof is the same as n1 in the formula (II).

The compound represented by the formula (III) is more preferably a compound represented by any one of the following formulae (IV) to (V).

The compound represented by the formula (IV);

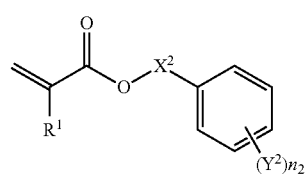

(IV)

(In the formula (IV), $R^1$ represents a hydrogen atom, an alkyl group, or a halogen atom; $X^2$ is a single bond, or a hydrocarbon group which may have a linking group containing a hetero atom in the chain of the linking group; $Y^2$ represents a substituent having a molecular weight of 15 or more, the substituent being other than an aromatic group-containing group; n2 represents an integer of 0 to 3, wherein n2 is 0, $X^2$ is a hydrocarbon group having carbon atoms of 2 or 3.

$R^1$ is the same as $R^1$ in the above formula and the preferable range thereof is the same as $R^1$ in the above formula.

When $X^2$ is a hydrocarbon group, $X^2$ is preferably a hydrocarbon having carbon atoms of 1 to 3, more preferably a hydrocarbon having a substituted or non-substituted alkylene group having carbon atoms of 1 to 3, further more preferably a non-substituted alkylene group having carbon atoms of 1 to 3, even more preferably ethylene group. Adoption of such a hydrocarbon group makes it possible to provide a photocurable composition having lower viscosity and low volatile.

$Y^2$ represents a substituent which has a molecular weight of 15 or more and the substituent is not an aromatic group-containing group. The upper limit of the molecular weight of $Y^2$ is preferably 80 or less. Examples of $Y^2$ include an alkyl group having 1 to 6 carbon atoms such as methyl group, ethyl group, isopropyl group, tert-butyl group, and cyclohexyl group, a halogen atom such as chlorine atom and bromo atom, and an alkoxy group having 1 to 6 carbon atoms such as methoxy group, ethoxy group, and cyclohexyloxy group.

n2 is preferably an integer of 0 to 2. When n2 is 1, the substituent $Y^2$ is preferably at para-position in the compound. When n2 is 2, $X^2$ is preferably a single bond, or a hydrocarbon group having one carbon atom from the viewpoints of the viscosity of the composition.

The composition represented by the formula (IV) is preferably a mono-functional (meth)acrylate having one (meth)acrylate group.

The molecular weight of the (meth)acrylate represented by the formula (IV) is preferably 175 to 250, more preferably 185 to 245 from the viewpoint of attainment of the low viscosity and the low volatility.

The viscosity at 25° C. of the (meth)acrylate represented by the formula (IV) is preferably 10 mPa·s or less, more preferably 60 mPa·s or less.

In addition, the compound represented by the formula (IV) preferably is used for a reaction diluent.

The amount of the compound represented by the formula (IV) to be added is preferably 10% by mass or more, more preferably 15% by mass or more, further more preferably 20% by mass or more from the viewpoint of the viscosity of the composition and the pattern accuracy of the cured film. While the amount thereof to be added is preferably 95% by mass or less, more preferably 90% by mass or less, further more preferably 85% by mass or less from the viewpoint of the tackiness of the cured film and the mechanical strength of the cured film.

Specific examples of the compounds represented by Formula (IV) are shown below, to which, however, the present invention should not be limited. $R^1$ in the formulae below represents any of hydrogen atom, alkyl group, halogen atom and cyano group.

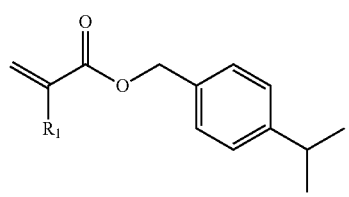

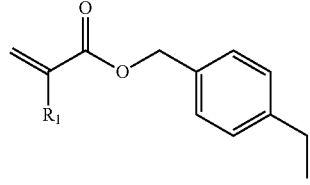

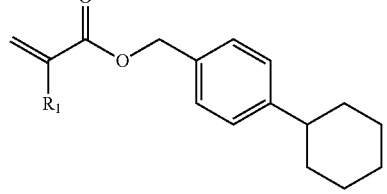

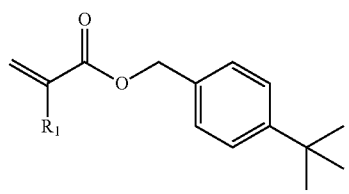

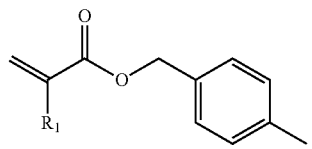

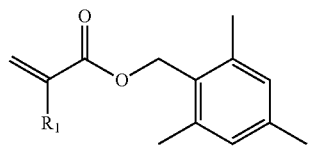

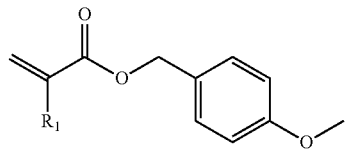

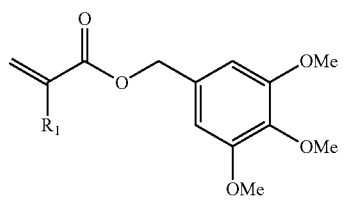

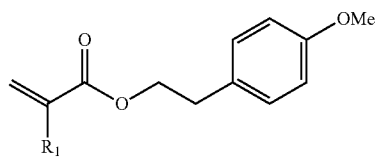

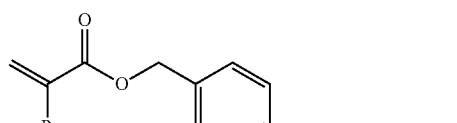

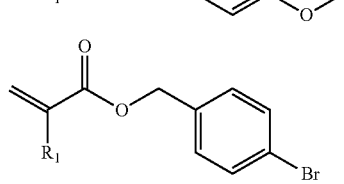

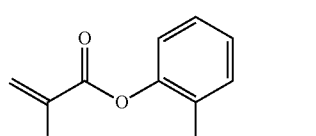

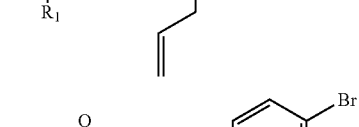

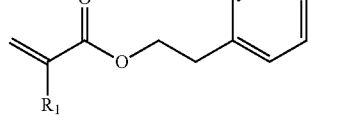

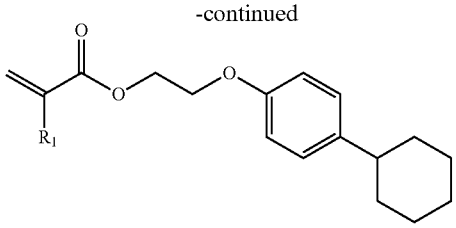

The compound represented by the formula (V);

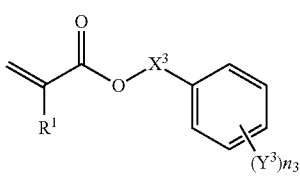

wherein $R^1$ represents a hydrogen atom, an alkyl group, or a halogen atom; $X^3$ is a single bond, or a hydrocarbon group which may have a linking group containing a hetero atom in the chain of the linking group; $Y^3$ represents a substituent having an aromatic group and having a molecular weight of 15 or more; and n3 represents an integer of 1 to 3.

$R^1$ is the same as $R^1$ in the above formula (I) and the preferable range thereof is the same as $R^1$ in the above formula (I).

$X^1$ is the same as $Z^1$ in the above formula and the preferable range thereof is the same as $Z^1$ in the above formula.

$Y^3$ represents a substituent having an aromatic group, and a preferred embodiment of the substituent having an aromatic group is the embodiment that an aromatic group bonds to the aromatic ring in the formula (V) directly, or via a linking group. Preferred example of the linking group thereof include an alkylene group, a linking group containing a hetero atom (preferably —O—, —S—, —C(=O)O—) and a combination thereof. Among them, an alkylene group, —O— and a combination thereof is more preferable. Embodiment in which a phenyl group bonds to the aromatic ring in the formula (V) directly, or via the above mentioned linking group is preferable. The substituent is preferably a phenyl group, a benzyl group, a phenoxy group, a benzyloxy group or a phenylthio group. The molecular weight of $Y^3$ is preferably 230 to 350.

n3 is preferably 1 or 2, more preferably 1.

The amount of the compound represented by the formula (V) to be added is preferably 10% by mass or more, more preferably 20% by mass or more, further more preferably 30% by mass or more. On the other hand, the amount thereof is preferably 90% by mass or less, more preferably 80% by mass or less, further more preferably 70% by mass, from the viewpoint of the tackiness and mechanical strength of the cured film.

Specific examples of the compounds represented by Formula (V) are shown below, to which, however, the present invention should not be limited. $R_1$ in the formulae below represents any of hydrogen atom, an alkyl group, a halogen atom and cyano group.

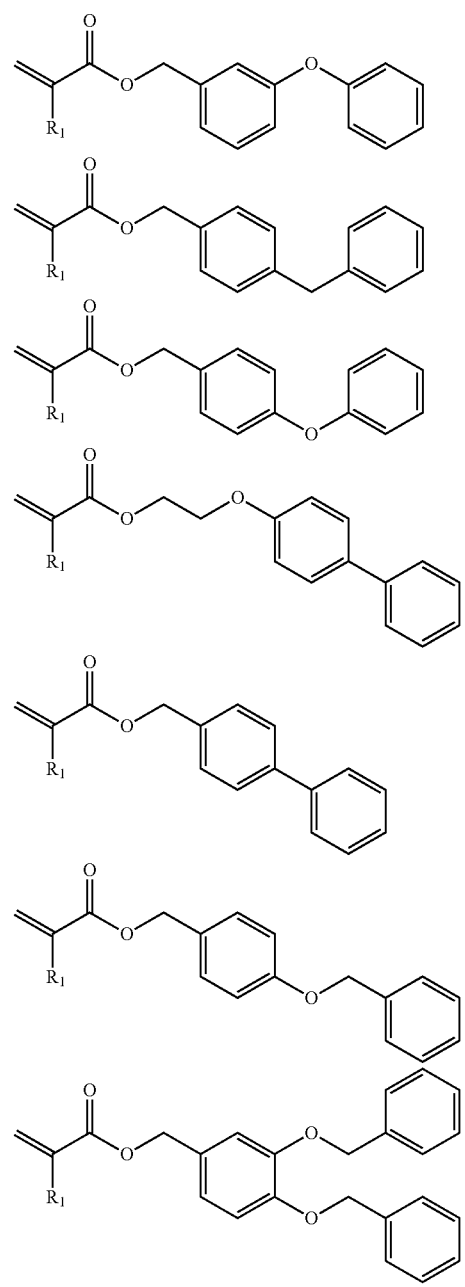

The compound represented by the formula (VI);

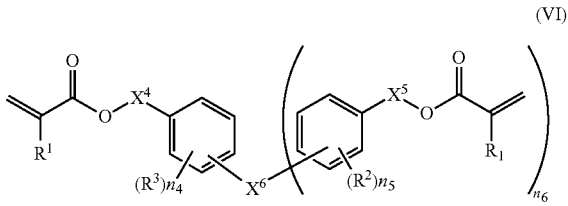

wherein $X^6$ is a (n6+1)-valent linking group; $R^1$ each are a hydrogen atom, an alkyl group, or a halogen atom; $R^2$ and $R^3$ each are a substituent; n4 and n5 each are an integer of 0 to 4; n6 is 1 or 2; and $X^4$ and $X^5$ each are a hydrocarbon group which may have a linking group containing a hetero atom in the chain of the linking group.

$X^6$ is a (n6+1)-valent linking group, preferably an alkylene group, —O—, —S—, —C(=O)O—, or a linking group consisting of a combination of two or more thereof. The alkylene group is preferably an alkylene group having 1 to 8 carbon atoms, more preferably an alkylene group having 1 to 3 carbon atoms. Also, the alkylene group is preferable an unsubstituted alkylene group.

n6 is preferably 1. When n6 is 2, the plural $R^1$, $X^5$ and $R^2$ existing in the formula may be the same or different.

$X^4$ and $X^5$ each are an alkylene group not having a linking group, more preferably an alkylene group having 1 to 5 carbon atoms, further more preferably an alkylene group having 1 to 3 carbon atoms, still more preferably a methylene group.

$R^1$ is the same as $R^1$ in the above formula (I) and the preferable range thereof is the same as $R^1$ in the above formula (I).

$R^2$ and $R^3$ each represent a substituent, preferably an alkyl group, a halogen atom, an alkoxy group, an acyl group, an acyloxy group, an alkoxycarbonyl group, a cyano group, a nitro group. The alkyl group is preferably an alkyl group having 1 to 8 carbon atoms. The halogen atom is exemplified by fluorine atom, chlorine atom, bromine atom and iodine atom, and is preferably fluorine atom. The alkoxy group is preferably an alkoxy group having 1 to 8 carbon atoms. The acyl group is preferably an acyl group having 1 to 8 carbon atoms. The acyloxy group is preferably an acyloxy group having 1 to 8 carbon atoms. The alkoxycarbonyl group is preferably an alkoxycarbonyl group having 1 to 8 carbon atoms.

n4 and n5 each are an integer of 0 to 4. When n4 or n5 is two or more, the plural $R^2$ and $R^3$ existing in the formula may be the same or different.

The compound represented by the formula (VI) is preferably a compound represented by the formula (VII);

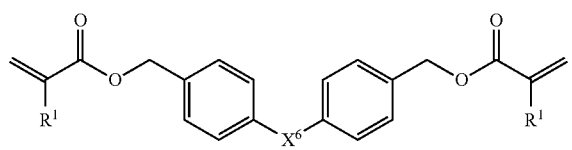

wherein $X^6$ represents an alkylene group, —O—, —S—, or a linking group which is combined with two or more thereof; $R^1$ each are a hydrogen atom, an alkyl group, or a halogen atom.

$R^1$ is the same as $R^1$ in the above formula (I) and the preferable range thereof is the same as $R^1$ in the above formula (I).

When $X^6$ is an alkylene group, the alkylene group is preferably an alkylene group having 1 to 8 carbon atoms, more preferably an alkylene group having 1 to 3 carbon atoms. The alkylene group is preferably an unsubstituted alkylene group.

$X^6$ is preferably —CH$_2$—, —CH$_2$CH$_2$—, —O—, or —S—.

The amount of the compound represented by the formula (VI) to be contained in the composition of the present invention is not defined. However, the content relative to the total amount of the polymerizable monomers is preferably 1 to 100% by mass, more preferably 5 to 70% by mass, further more preferably 10 to 50% by mass from the viewpoint of the curability and the viscosity of the composition.

Specific examples of the compounds represented by Formula (VI) are shown below, to which, however, the present invention should not be limited, wherein $R^1$ in the following is the same as $R^1$ in the above formula (VI), the preferable range thereof is the same as $R^1$ in the above formula (VI). The $R^1$ is more preferably a hydrogen atom.

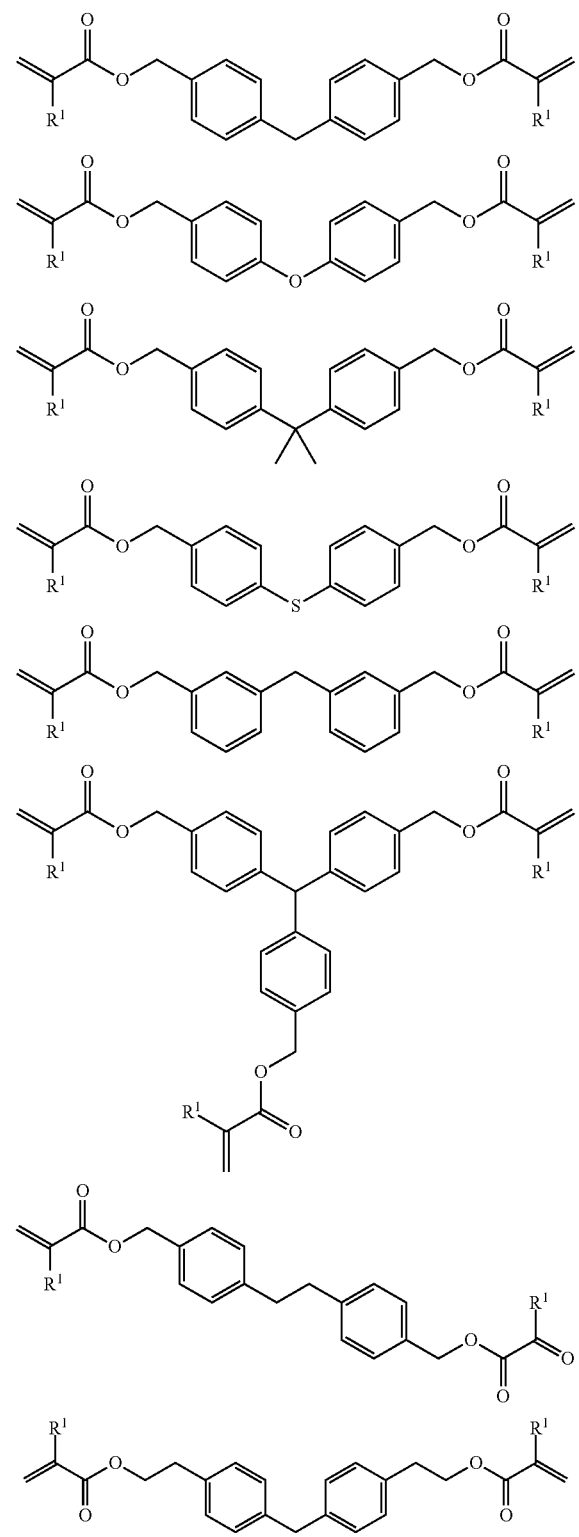

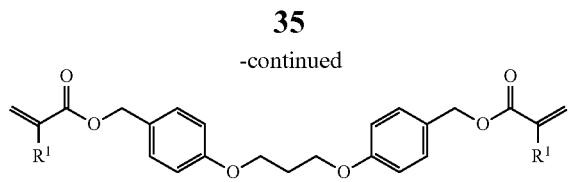

(Group 5) Polymerizable monomers represented by the following formula;

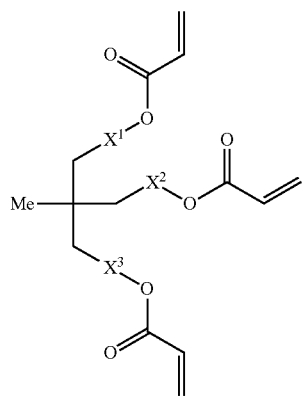

(In the formula, $X^1$ to $X^3$ each independently are a single bond, or a linking group. Me stands for methyl group)

When $X^1$ to $X^3$ is a linking group, it is preferably an organic linking group, which is preferably an organic group having carbon atoms of 1 to 50. Specific examples of the organic linking group include oxyalkylene group, —O—C(=O)—, alkylene group, and a group comprising at least two of those groups. The oxyalkylene group is exemplified by ethylene oxide group, or propylene oxide group. The alkylene group is exemplified by propylene group, butylene group, pentyl group, or hexyl group. $X^1$ to $X^3$ is preferably a single bond. The compound represented by the formula is preferably liquid at 25° C., but it may not be liquid.

Hereinunder, specific examples of the polymerizable monomers in the present invention are shown below.

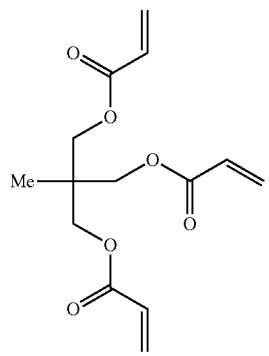

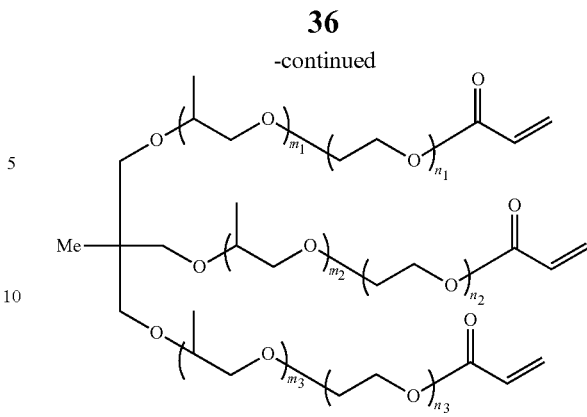

wherein $m^1$, $m^2$, $m^3$, $n^1$, $n^2$, $n^3$ each are an integer of 0 to 10. The sum of $m^1$, $m^2$, $m^3$, $n^1$, $n^2$ and $n^3$ is more than 1, or a mixture of compounds in which the average of the sum of $m^1$, $m^2$, $m^3$, $n^1$, $n^2$ and $n^3$ is more than 1.

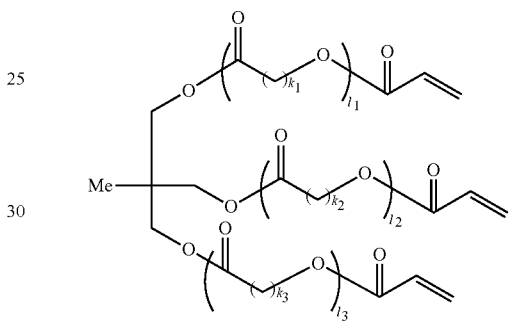

wherein $l^1$, $l^2$, and $l^3$ each are an integer of 0 to 10, $k^1$, $k^2$, and $k^3$ are an integer of 3 to 6. The sum of $l^1$, $l^2$ and $l^3$ is more than 1, or a mixture of compounds in which the average of the sum of $l^1$, $l^2$ and $l^3$ is more than 1.

(Group 6) Polymerizable monomers represented by the following formula;

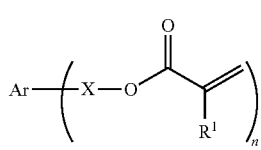

(I)

wherein Ar is an arylene group which may have a substituent, X is a single bond or an organic linking group, $R^1$ is hydrogen atom or methyl group, and n is 2 or 3.

In the formula, the above arylene group is exemplified by a hydrocarbon arylene group such as phenylene group and naphthylene group and a heteroarylene group which is a crosslinking group derived from indole or carbazole, and is preferably phenylene group from the viewpoints of the viscosity and the etching resistance. The above arylene group may have a substituent, and examples of the preferable substituent thereof include an alkyl group, an alkoxy group, hydroxy group, an alkoxycarbonyl group, an amide group, and a sulfone amide group.

The organic linking group in the above X is exemplified by an alkylene group, an arylene group and an aralkylene group which may include a hetero atom in the chain. Of those, preferred are an alkylene group and an arylene group, more preferred is an alkylene group. The above X is particularly preferably a single bond or an alkylene.

The above $R^1$ is hydrogen atom or methyl group, preferably hydrogen atom.

n is 2 or 3, preferably 2.

The above polymerizable monomer is preferably the following formula (I-a) or the following formula (I-b) from the viewpoint of reduction of the viscosity of the composition.

(I-a)

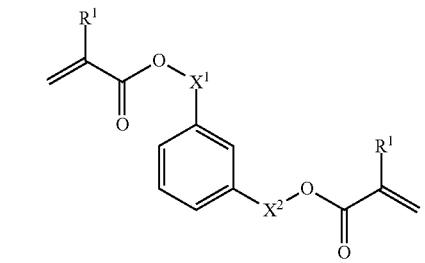

(I-b)

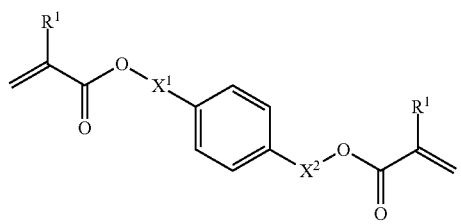

wherein $X^1$ and $X^2$ each independently are a single bond or an alkylene group which may have a substituent having 1 to 3 carbon atoms, $R^1$ is hydrogen atom or methyl group.

In the formula (I-a), the above $X^1$ is preferably a single bond or methylene group, more preferably methylene group from the viewpoint of reduction of the viscosity.

The preferred range of the above $X^2$ is the same as the above $X^1$.

The above $R^1$ is the same as $R^1$ in the above formula (VIII) and the preferred range is also the same.

The above polymerizable monomer is preferably liquid at 25° C. since liquid can control occurring foreign substance if the amount to be added thereof is increased.

Specific examples of the polymerizable monomer represented by the formula (VIII) are shown below. $R^1$ is the same as $R^1$ in the formula (VIII) and represents hydrogen atom or methyl group. The present invention is not limited thereto.

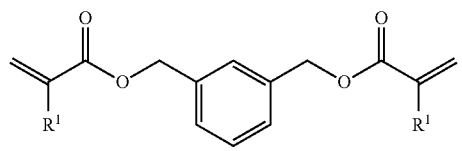

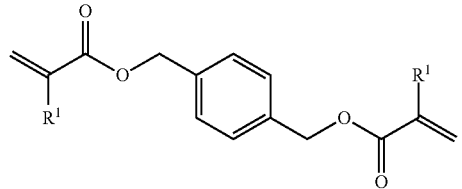

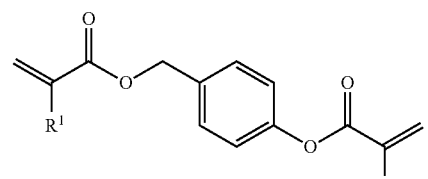

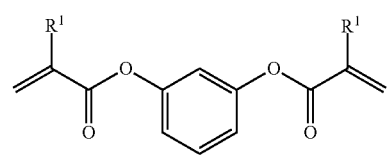

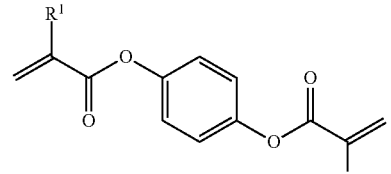

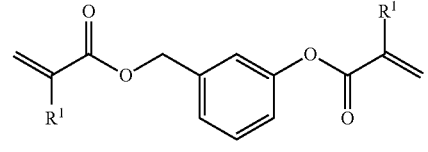

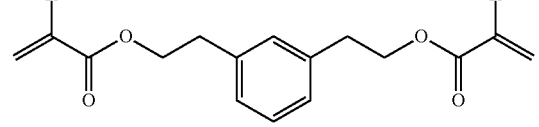

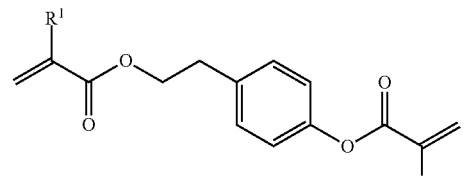

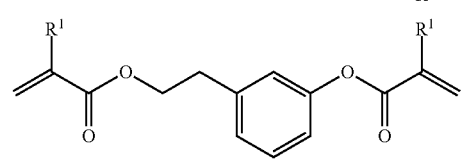

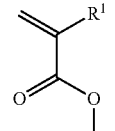

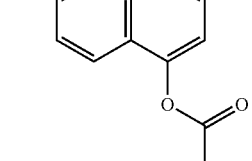

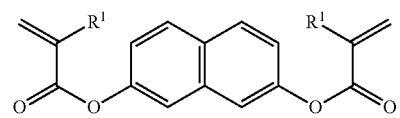

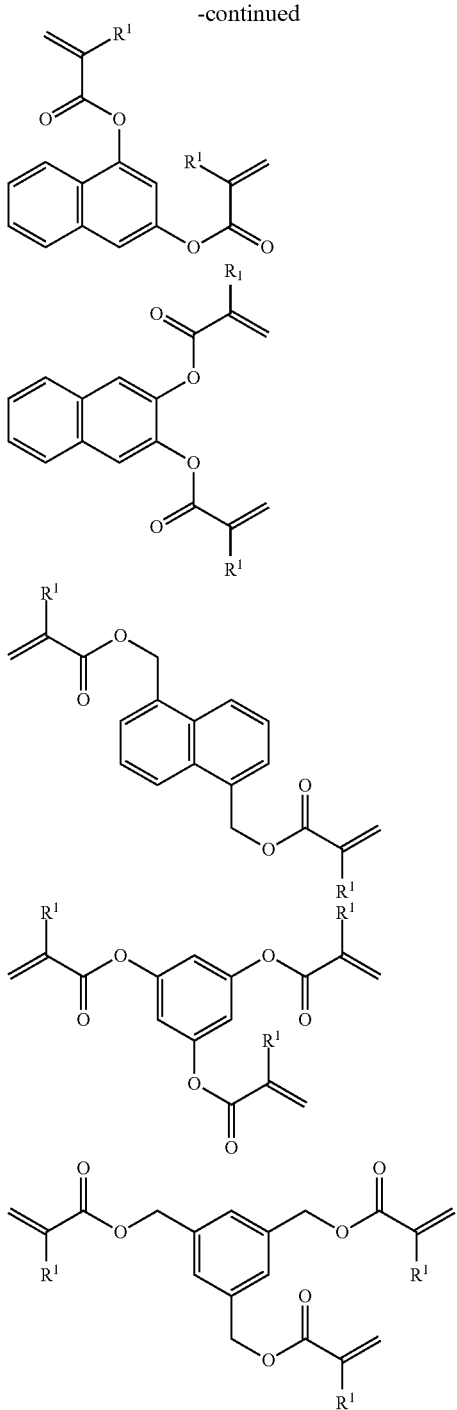

(B) Photo-Polymerization Initiator

The curable composition for use in the present invention contains a photo-polymerization initiator. The photo-polymerization initiator used in the present invention may be anything so far as it can generate, upon irradiation of light, an active species which promotes polymerization of the polymerizable monomer. The photo-polymerization initiator may be exemplified by cationic polymerization initiator and radical polymerization initiator, wherein the radical polymerization initiator is preferable. In the present invention, a plurality of species of photo-polymerization initiator may be used in combination.

Content of the photo-polymerization initiator used for the present invention, relative to the total composition excluding solvent, is typically 0.01 to 15% by mass, preferably 0.1 to 12% by mass, and still more preferably 0.2 to 7% by mass. For the case where two or more species of photo-polymerization initiators are used, the total amount is adjusted to the above-described ranges.

A content of photo-polymerization initiator of 0.01% by mass or above is preferable since the sensitivity (quick curability), resolution, line edge roughness, and film strength tend to improve. On the other hand, a content of photo-polymerization initiator of 15% by mass or less is preferable since the transmissivity of light, coloration and handlability tend to improve. In a system containing dye and/or pigment, they may occasionally act as a radical trapping agent, and may therefore adversely affect the photo-polymerization performance and sensitivity. Taking this point into consideration, the amount of addition of the photo-polymerization initiator is optimized for this sort of application.

Commercially available initiators may be adoptable to the radical photo-polymerization initiator in the present invention. Those described in paragraph [0091] in Japanese Laid-Open Patent Publication No. 2008-105414 may preferably be used. Among them, acetophenone-base compound, acylphosphine oxide-base compound, and oxime ester-base compound are preferable from the viewpoint of curing sensitivity and absorption characteristics.

The acetophenone-base compound may preferably be exemplified by hydroxyacetophenone-base compound, dialkoxyacetophenone-base compound, and aminoacetophenone-base compound. The hydroxyacetophenone-base compound may preferably be exemplified by Irgacure (registered trademark) 2959 (1-[4-(2-hydroxyethoxy) phenyl]-2-hydroxy-2-methyl-1-propane-1-one, Irgacure (registered trademark) 184 (1-hydroxycyclohexylphenylketone), Irgacure (registered trademark) 500 (1-hydroxycyclohexylphenylketone, benzophenone), Darocur (registered trademark) 1173 (2-hydroxy-2-methyl-1-phenyl-1-propane-1-one), all of which are available from Ciba Specialty Chemicals Inc.

The dialkoxyacetophenone-base compound may preferably be exemplified by Irgacure (registered trademark) 651 (2,2-dimethoxy-1,2-diphenylethane-1-one) available from Ciba Specialty Chemicals Inc.

The aminoacetophenone-base compound may preferably be exemplified by Irgacure (registered trademark) 369 (2-benzyl-2-dimethylamino-1-(4-morpholinophenyl) butanone-1), Irgacure (registered trademark) 379 (EG) (2-dimethylamino-2-(4-methylbenzyl)-1-(4-morpholine-4-yl-phenyl) butane-1-one, and Irgacure (registered trademark) 907 (2-methyl-1-[4-methylthiophenyl]-2-morpholinopropane-1-one), all of which are available from Ciba Specialty Chemicals Inc.

The acylphosphine oxide-base compound may preferably be exemplified by Irgacure (registered trademark) 819 (bis(2,4,6-trimethylbenzoyl)-phenylphosphine oxide), and Irgacure (registered trademark) 1800 (bis(2,6-dimethoxybenzoyl)-2,4,4-trimethyl-pentylphosphine oxide), all of which are available from Ciba Specialty Chemicals Inc.; and Lucirin TPO (2,4,6-trimethylbenzoyldiphenylphosphine oxide), and Lucirin TPO-L (2,4,6-trimethylbenzoylphenylethoxyphosphine oxide), all of which are available from BASF.

The oxime ester-base compound may preferably be exemplified by Irgacure (registered trademark) OXE01 (1,2-octanedione, 1-[4-(phenylthio) phenyl]-2-(O-benzoyloxime)), and Irgacure (registered trademark) OXE02 (ethanone, 1-[9- ethyl-6-(2-methylbenzoyl)-9H-carbazole-3-yl]-1-(O-acetyloxime)), all of which are available from Ciba Specialty Chemicals Inc.

The cation photo-polymerization initiator adoptable to the present invention is preferably sulfonium salt compound, iodonium salt compound, and oxime sulfonate compound, and may preferably be exemplified by 4-methylphenyl [4-(1-methylethyl) phenyliodonium tetrakis(pentafluorophenyl) borate (PI2074, from Rhodia), 4-methylphenyl [4-(2-methylpropyl) phenyliodonium hexafluorophophate (Irgacure 250, from Ciba Specialty Chemicals Inc.), Irgacure PAG103, 108, 121 and 203 (from Ciba Specialty Chemicals Inc.).

(Other Ingredients)

In accordance with various objects, in addition to the above ingredient, the photo-curable composition of the present invention may contain any other ingredients such as surfactants, antioxidants, solvents, polymers and the like, without impairing the effect of the present invention.

The photo-curable composition for use in the present invention may contain colorants, dyes, pigments or the like, but preferably does not contain the colorant and the like from the viewpoint of the more effective exertion of the effect of the present invention.

—Surfactant—

Preferably, the curable composition of the present invention contains a surfactant. The content of the surfactant that may be in the composition may be, for example, from 0.001 to 5% by mass of the composition, preferably from 0.002 to 4% by mass, more preferably from 0.005 to 3% by mass. In case where two or more different types of surfactants are in the composition, the total amount thereof falls within the above range. When the surfactant content in the composition is less than 0.001 5% by mass, it is unfavorable from the viewpoint of the coating uniformity. On the other hand, the surfactant is more than 5% by mass, it is unfavorable from the viewpoint of worsening the mold transferability.

As the surfactant, preferably, the composition contains at least one of a non-ionic surfactant, more preferably a fluorine-containing surfactant, a silicone-type surfactant, a fluorine-containing silicone-type surfactant, further more preferably contains both of a fluorine-containing surfactant and a silicone-type surfactant, or contains a fluorine-containing silicone-type surfactant, most preferably contains a fluorine-containing silicone-type surfactant. The fluorine-containing surfactant and the silicone-type surfactant are preferably non-ionic surfactants.

"Fluorine-containing silicone-type surfactant" as referred to herein means a surfactant satisfying both the requirement of a fluorine-containing surfactant and that of a silicone-type surfactant.

Using the surfactant of the type may solve the problem of coating failures such as striation and flaky pattern formation (drying unevenness of resist film) that may occur when the curable composition of the present invention is applied onto substrates on which various films are formed, for example, onto silicon wafers in semiconductor production, or onto glass square substrates, chromium films, molybdenum films, molybdenum alloy films, tantalum films, tantalum alloy films, silicon nitride films, amorphous silicon films, tin oxide-doped indium oxide (ITO) films or tin oxide films in production of liquid-crystal devices. In addition, the surfactant is effective for enhancing the flowability of the composition of the present invention in the cavity of a female mold, for enhancing the mold-resist releasability, for enhancing the resist adhesiveness to substrates, and for lowering the viscosity of the composition. In particular, when the above-mentioned surfactant is added to the composition of the present invention, the coating uniformity of the composition can be greatly improved; and in coating with it using a spin coater or a slit scan coater, the composition ensures good coating aptitude irrespective of the size of the substrate to which it is applied.

Examples of the nonionic fluorine-containing surfactant usable in the present invention include Fluorad FC-430, FC-431 (Sumitomo 3M's trade names); Surflon S-382 (Asahi Glass's trade name); Eftop EF-122A, 122B, 122C EF-121, EF-126, EF-127, MF-100 (Tochem Products' trade names); PF-636, PF-6320, PF-656, PF-6520 (Omnova Solution's trade names); Futagent FT250, FT251, DFX18 (Neos' trade names); Unidyne DS-401, DS-403, DS-451 (Daikin's trade names); Megafac 171, 172, 173, 178K, 178A (Dai-Nippon Ink's trade names).

Examples of the nonionic silicone-type surfactant include SI-10 series (Takemoto Yushi's trade name), Megafac 31 (DIC's trade name), KP-341 (Shin-Etsu Chemical's trade name).

Examples of the fluorine-containing silicone-type surfactant include X-70-090, X-70-091, X-70-092, X-70-093 (Shin-Etsu Chemical's trade names); Megafac R-08, XRB-4 (Dai-Nippon Ink's trade names).

—Antioxidant—

Preferably, the curable composition of the present invention contains a known antioxidant. The content of the antioxidant to be in the composition is, for example, from 0.01 to 10% by mass of the total amount of the polymerizable monomers constituting the composition, preferably from 0.2 to 5% by mass. When two or more different types of antioxidants are in the composition, the total amount thereof falls within the above range.

The antioxidant is for preventing fading by heat or photoirradiation, and for preventing fading by various gases such as ozone, active hydrogen NOx, SOx (x is an integer), etc. Especially in the present invention, the antioxidant added to the composition brings about the advantage that the cured film is prevented from being discolored and the film thickness is prevented from being reduced through decomposition. The antioxidant includes hydrazides, hindered amine-type antioxidants, nitrogen-containing heterocyclic mercapto compounds, thioether-type antioxidants, hindered phenol-type antioxidants, ascorbic acids, zinc sulfate, thiocyanates, thiourea derivatives, saccharides, nitrites, sulfites, thiosulfates, hydroxylamine derivatives, etc. Of those, preferred are hindered phenol-type antioxidants and thioether-type antioxidants from the viewpoint of their effect of preventing cured film discoloration and preventing film thickness reduction.

Commercial products of the antioxidant usable herein include Irganox 1010, 1035, 1076, 1222 (all by Ciba-Geigy); Antigene P, 3C, FR, Sumilizer S, Sumilizer GA80 (by Sumitomo Chemical); Adekastab AO70, AO80, AO503 (by Adeka), etc. These may be used either singly or as combined.

—Polymerization Inhibitor—

Furthermore, the curable composition of the present invention preferably comprises a polymerization inhibitor. The content of the polymerization inhibitor is from 0.001 to 1% by mass, more preferably from 0.005 to 0.5% by mass, and even more preferably from 0.008 to 0.05% by mass, relative to all the polymerizable monomers, and the change in the viscosities over time can be inhibited while maintaining a high curing sensitivity by blending the polymerization inhibitor in an appropriate amount. The polymerization inhibitor may be added at the production of the polymerizable monomer or may be added the curable composition after the production of the polymerizable monomer.

From the photo-curable composition of the present invention, an impurity polymer comprising a polymerizable monomer as a repeating unit is preferably removed. The method for removing it may be referred to the description of the above maintenance liquid.

The polymerizable monomer, after being separated from the deposited polymer, is then added to the curable composition, in a form of the resultant solution without further treatment, or after condensation or replacement of solvent. In the present invention, it is also preferable to add a polymerization inhibitor in the manufacturing process of the polymerizable monomer, wherein it is more preferable to add it in the preceding stage of condensation.

The polymerization inhibitor may be exemplified by hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-tert-butylphenol), cerium (III) salt of N-nitrosophenyl hydroxylamine, phenothiazine, phenoxazine, 4-methoxynaphthol, 2,2,6,6-tetramethylpiperidine-1-oxyl, free radical, 2,2,6,6-tetramethylpiperidine, 4-hydroxy-2,2,6,6-tetramethylpiperidine-1-oxyl, free radical, nitrobenzene, and dimethylaniline; among which preferable examples include p-benzoquinone, 2,2,6,6-tetramethylpiperidine-1-oxyl, free radical, 4-hydroxy-2,2,6,6-tetramethylpiperidine-1-oxyl, free radical, and phenothiazine. The polymerization inhibitor suppresses production of the polymer impurity not only in the process of manufacturing the polymerizable monomer, but also during storage of the curable composition, and thereby suppresses degradation of pattern formability in the process of imprint.

A method of forming a pattern (pattern transfer method) using the photo-curable composition will be detailed below.

In the pattern forming method, first the photo-curable composition is placed by ink-jet discharging on a substrate or a mold having a fine pattern formed thereon, so as to form a pattern forming layer. Liquid droplets placed by the ink-jet discharging may be spaced from each other, or fused with each other. Volume of the liquid droplets is preferably 1 pl to 20 pl or around. The total volume of the liquid droplets may vary depending on the pattern to be formed, and is adjusted so as to give appropriate thickness of the pattern and the obtained film. It is also preferable to make the intervals of the liquid droplets non-uniform, depending on density of the pattern.

Other conditions may be referred to the description in paragraphs [0103] to [0115] in Japanese Laid-Open Patent Publication No. 2010-109092.

The pattern formed according to the patterning method of the invention is useful as an etching resist. In case where the composition for imprints of the invention is used as an etching resist, a nano-order, micro-pattern is first formed on a substrate such as a silicon wafer with a thin film of $SiO_2$ or the like formed thereon, according to the patterning method of the invention. Next, this is etched with hydrogen fluoride in wet etching, or with $CF_4$ in dry etching, thereby forming a desired pattern on the substrate. The curable composition for imprints of the invention exhibits especially good etching resistance in dry etching.

EXAMPLES

The present invention will be further specifically explained with reference to the following examples of the present invention. In the following Examples, the material used, its amount and the ratio, the details of the treatment and the treatment process may be suitably modified or changed not overstepping the scope of the present invention. Accordingly, the present invention should not be limitatively interpreted by the Examples mentioned below.

(Preparation of Maintenance Liquid)

The materials were mixed according to ratios listed in Table 3. The polymerizable monomers (X4) to (X6) for used in the maintenance liquid and the polymerizable monomers (M1) to (M6) for use in the curable composition each were prepared by solving the polymerizable monomer in methanol and, then removing polymer ingredients of the polymerizable monomer through a filtration using a 0.1-μm tetrafluoroethylene filter and condensing the polymerizable monomer. GPC measurement for the polymerizable monomer was carried out, and it was found that the polymer ingredients of the polymerizable monomer were not detected.

(GPC Condition)

In GPC measurement in Examples, 2695 separation module manufactured by Waters was used and the column used herein was a column which is obtained by connecting three of KF-805 manufactured by Shodex.

Tetrahydrofuran was used as an eluant solution, and the flow velocity was 1 mL/min at 40° C. As a decetror, a RI detector (2414, from Waters Corporation), or a light scattering detector (DAWN-EOS, from Wyatt Technology Corporation) was used. DAWN-EOS was connected to WyattQels and the scattering light at 90 degree was observed.

TABLE 1

| | | Boiling point | Viscosity (25° C.) |
|---|---|---|---|
| (X1) Invention | propylene grycol monomethyl ether acetate manufactured by Daicel Chemical industries, Ltd. | 146° C. | 1.3 mPa · s |
| (X2) Invention | diethylene glycol monobuthylether manufactured by Daicel Chemical Industries, Ltd. | 230.6° C. | 6.5 mPa · s |
| (X3) Invention | diethylene glycol monoethyl ether acetate manufactured by Daicel chemical industries, Ltd. | 217° C. | 2.8 mPa · s |
| (X4) Invention | hexanediol diacrylate manufactured by Osaka Organic Chemical Industry Ltd. | >200° C. | 7.0 mPa · s |
| (X5) Invention | phenoxyethyl acrylate manufactured by Osaka Organic Chemical Industry Ltd. | >200° C. | 3.3 mPa · s |
| (X6) Invention | 1,3-bis(acryloxy methyl) benzene (synthesized from α,α'-dichloro-m-xylene and acrylic acid) | >200° C. | 9.5 mPa · s |
| (X7) Comparative Invention | cyclohexane | 157° C. | 2.4 mPa · s |
| (X8) Comparative Invention | benzyl alcohol | 200° C. | 6.5 mPa · s |

The viscosity was measured at 25±0.2° C., using a rotary viscometer RE-80L from Toki Sangyo Co, Ltd.

(Preparation of Photo-Curable Composition)

The photo-curable compositions were prepared by mixing the polymerizable monomers, photo-polymerization initiators, and surfactants listed below up to total 100% by mass, according to ratios listed in Table below.

<Polymerizable Monomers>
M1: hexanediol diacrylate: V#230 from Osaka Organic Chemical Industry Ltd.
M2: phenoxyethyl acrylate: fromOsaka Organic Chemical Industry Ltd., V#192
M3: 1,3-bis(acryloxymethyl)benzene, synthesized from α,α'-dichloro-m-xylene and acrylic acid
M4: isobornyl acrylate: IBXA from Osaka Organic Chemical Industry Ltd.
M5: tricyclodecane dimethanol diacrylate: NK ester A-DCP from Shin-Nakamura Chemical Co., Ltd.
M6: perfluorohexylethyl acrylate: from Kanto Chemical Co., Inc.
<Photo-Polymerization Initiators>
P1: IRGACURE-379EG (from CIBA Specialty Chemicals Inc.)
P2: IRGACURE-OXE01 (from CIBA Specialty Chemicals Inc.)<
<Surfactants>
W1: fluorine-containing surfactant (PF-656 from OMNOVA Solutions Inc.)
W2: silicone-based surfactant (Megafac from DIC Corporation)

TABLE 2

| | Polymerizable monomer | Polymerization initiator | Surfactant |
|---|---|---|---|
| Curable composition (Y1) | M1 (97) | P1 (2) | W1 (0.01) W2 (0.02) |
| Curable composition (Y2) | M4 (48) M5 (48) | P1 (4) | W1 (0.01) W2 (0.02) |
| Curable composition (Y3) | M3 (95) M6 (3) | P1 (2) | |
| Curable composition (Y4) | M2 (48) M3 (48) M6 (2) | P2 (2) | |

Values in the parentheses represent ratios by weight of amounts of mixing of the individual components.
<Evaluation of Pattern Formability>

A pattern was formed according to the procedures described below, based on combinations of the maintenance liquids and the photo-curable compositions listed in Table below, and pattern formability was evaluated. An ink-jetting head SX3 from FUJIFILM Dimatix, Inc. was used in this experiment.

The maintenance liquid having been filled in the ink-jetting head was replaced by the photo-curable composition, so as to fill up the head. The nozzle surface was cleaned with the maintenance liquid, and the photo-curable composition was discharged through the ink-jetting head onto a silicon wafer at a predetermined pitch. Specific procedures are as follows.

(Filling of Maintenance Liquid)

In a flow path configuration illustrated in FIG. 1, first the pressure controller was set to 30 kPa, and the maintenance liquid was fed to the ink-jetting head. In this process, a valve on the output side of the ink-jetting head was opened so as to thoroughly purge bubbles in the head. After confirming that the bubbles were no more output from the output side, the pressure controller was set to 0 kPa, and the valve on the output side was closed. The pressure controller was then set to 10 kPa, and the maintenance liquid was discharged out through the nozzles. After confirming that all nozzles participate in discharging, the pressure was set to −0.75 kPa.

The pressure controller adopted herein was PC71 from Nagano Keiki Co., Ltd. In order to avoid entrainment of bubbles into the head, a deaerating module EF-G3 from DIC Corporation was placed between the head and each of the maintenance liquid tank and the photo-curable composition tank.

Note that, in FIG. 1, reference numeral 1 stands for a pressure controller on the photo-curable composition side, 2 for a controller on the maintenance liquid side, 3 to 6 for filters, 7 for photo-curable composition tank, 8 for a maintenance liquid tank, 9 for a three-way valve, 10 for a debubbler, 11 for a waste liquid tank, 12 for a deaerating module, 13 for an ink-jetting head, 14 for an ink receiver, 15 for a valve, and 16 for a waste liquid tank.

(Filling with Photo-Curable Composition)

Next, the three-way valve was turned so as to activate the pressure controller connected to the tank having the photo-curable composition stored therein, to thereby feed the photo-curable composition to the ink-jetting head. In this process, the valve on the output side of the ink-jetting head was opened, and the pressure controller was operated at 30 kPa. When bubbles were caught between the maintenance liquid and the photo-curable composition, the three-way valve was turned so as to activate the debubbler, so as to avoid entrainment of the bubbles into the head. After confirming thorough removal of the bubbles, the three-way valve was turned so that the photo-curable composition may be fed to the head.

A sufficient volume of the photo-curable composition, enough to purge the maintenance liquid from the output side of the head, was fed. The amount of feeding herein was 200 ml. Thereafter, the pressure controller was set to 0 kPa, the valve on the output side was closed, the pressure controller was set to 10 kPa, and the maintenance liquid and the photo-curable composition were discharged out through the nozzles. After confirming that a sufficient volume (20 ml) of discharging was accomplished so as to thoroughly purge the maintenance liquid (20 ml), and that all nozzles participates in the discharging, the pressure was set to −0.75 kPa.

(Cleaning of Nozzle Surface)

The nozzles of the ink-jetting head used in this embodiment were cleaned as described below.

The nozzles were cleaned using a maintenance mechanism illustrated in FIGS. 2A to 2D. An ink-jetting head 21 was brought down so that the nozzle surface 20 may be brought into contact with the maintenance liquid of the wiping unit 29 and the coating unit 27, and then moved in the direction indicated by an arrow in the drawing (see FIG. 2B). In this process, the coating roller 25 dragged up the maintenance liquid 28 reserved in the maintenance liquid tray 26, while rotating in the same direction with the direction or travel of the head unit 21, and formed a maintenance liquid film on the outer surface thereof. The unwinding unit 31 and the take-up unit 33 were driven so as to allow the wiping sheet 30 to travel reversely to the direction of travel of the head 21.

Figure 2:
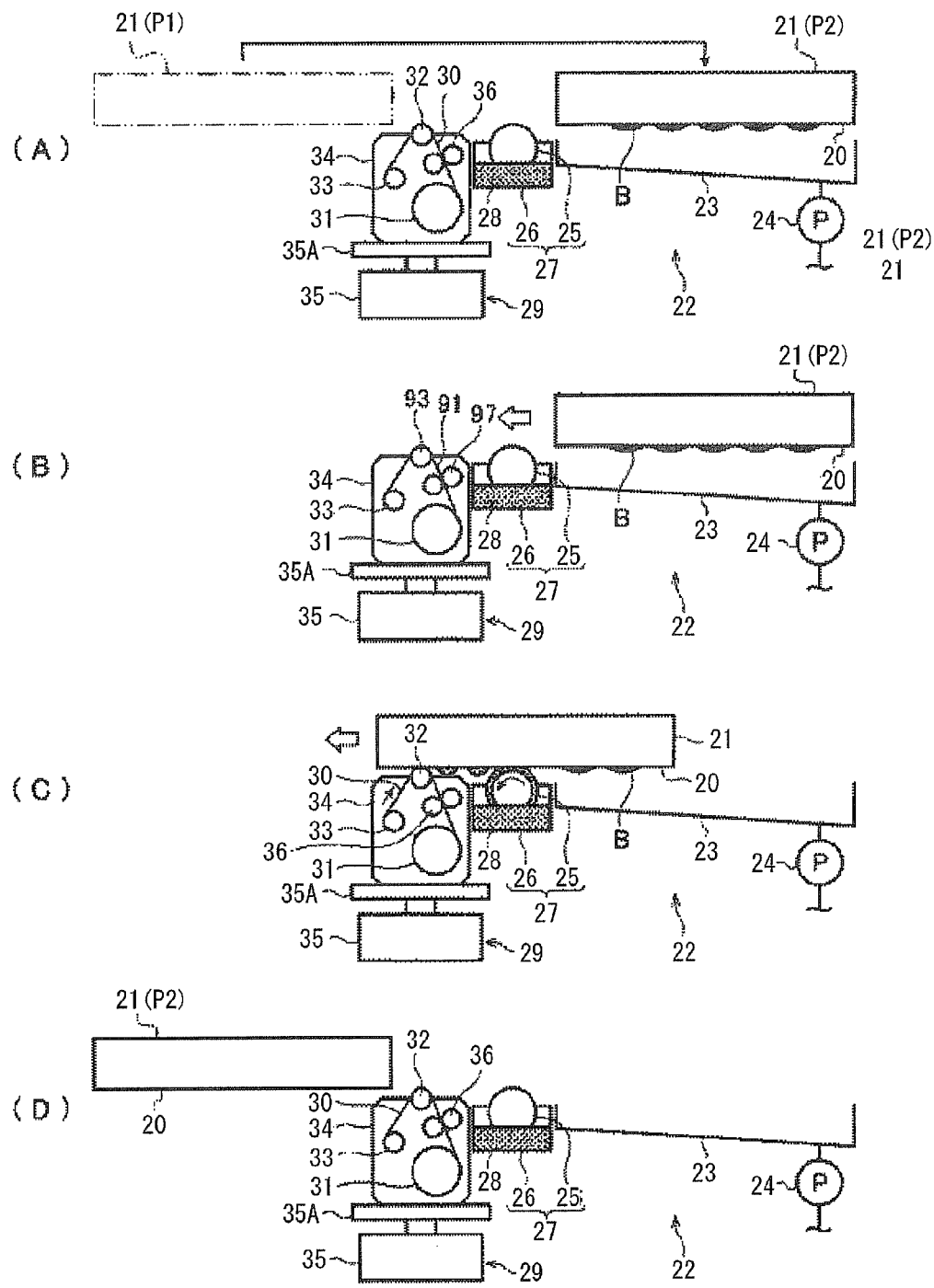
FIGS. 2A to 2D are schematic drawings illustrating a method of cleaning of a nozzle surface carried out in the embodiment of the present invention.

The nozzle surface 20 of the ink-jetting head 21 traveled in the direction indicated by the arrow in FIG. 2A to reach a position above the coating roller 25, brought into contact with the maintenance liquid film formed on the surface of the coating roller 25, and thereby coated with the maintenance liquid 28. The nozzle surface 20 was further moved while keeping the maintenance liquid 28 coated thereon. If the photo-curable composition or the like adhered to the nozzle surface 20 at this time, the adherent may be dissolved by the maintenance liquid 28. The nozzle surface 20 then reached a position above the wiping roller unit 32. At this position, the wiping sheet 36 was pressed against the nozzle surface 20, and thereby adherent B dissolved by the maintenance liquid 28 was wiped by the wiping sheet 36 (see FIG. 2C). Coating of the maintenance liquid 28 by the coating roller 25 and wiping by the wiping sheet 36 take place in succession, and thereby the adherent B over the entire surface of the nozzle surface 20 was wiped off (see FIG. 2D).

The maintenance liquid film of 0.5 mm thick was then formed on the coating roller, while setting the diameter of the coating roller to 40 mm and the number of rotation of the coating roller to 600 rpm, and the maintenance liquid was coated over the nozzle surface, while setting the travel speed of the head to 80 mm/sec. The wiping sheet adopted herein was Toraysee (from Toray Industries, Inc.), used for wiping the nozzle surface while being moved at 1.5 mm/sec reversely to the direction of travel of the head.

In FIGS. 2A to 2D, B stands for a photo-curable composition, 20 for a nozzle surface, 21 for an ink-jetting head, 22 for a maintenance unit, 23 for a waste liquid tray, 24 for an output path, 25 for a coating roller, 26 for a tray, 27 for a coating unit, 28 for a maintenance liquid, 29 for a wiping unit, 30 for a wiping sheet, 31 for a unwinding unit, 32 for a wiping roller unit, 33 for a take-up unit, 34 for an enclosure, 35 for a vertical movement mechanism, 35A for a traveling stage, and 36 for a conveyance roller.

(Dispensing of Photo-Curable Composition)

Using the ink-jetting head having the nozzle surface thereof thus cleaned up, the photo-curable composition was discharged onto the silicon wafer.

Figure 3:
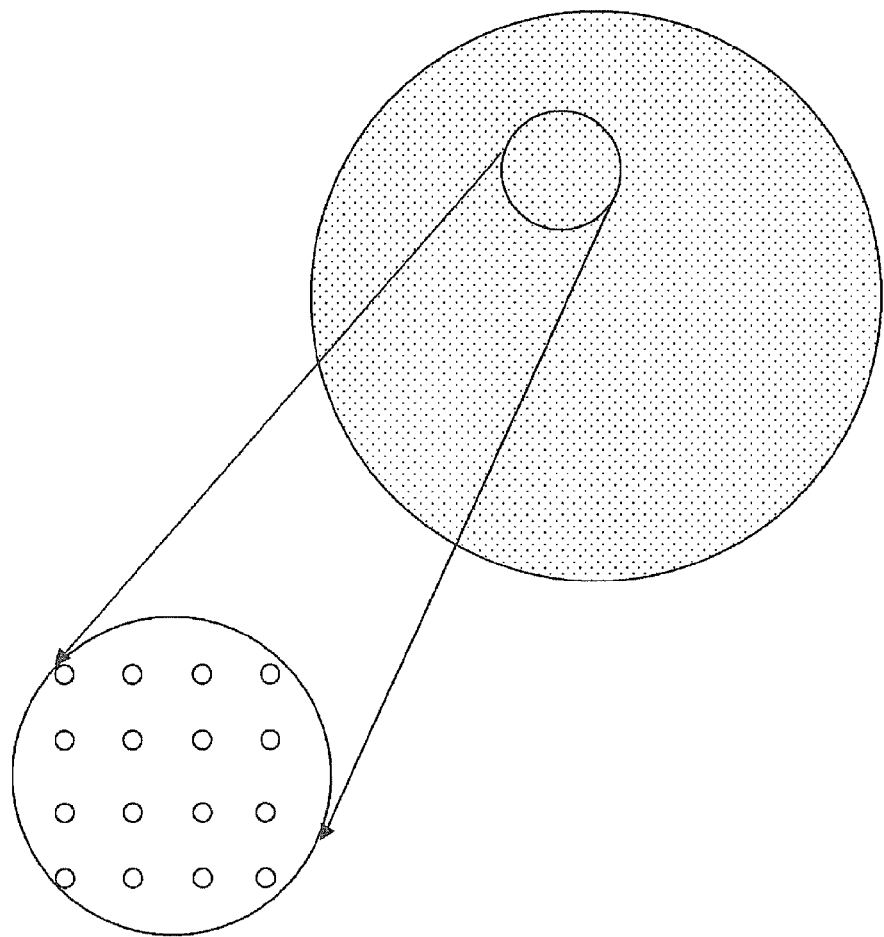
FIGS. 3A and 3B are schematic drawings illustrating a state of discharging of the photo-curable composition onto a silicon wafer carried out in the embodiment of the present invention, where
Figure 3:
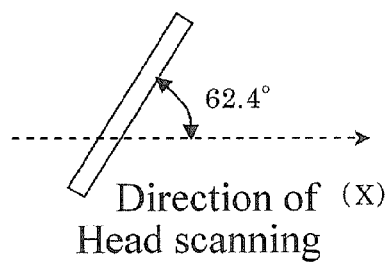

After confirming that all nozzles participate in the discharging, the photo-curable composition was discharged at a volume of droplet per nozzle of 8 pl, while scanning the head in the X-direction, and controlling the discharging time so as to align the droplets at 450-μm intervals on the silicon wafer. The composition was discharged also in the direction normal to the X-direction at 450-μm intervals, by rotating the head. Since the nozzles of the ink-jetting head SX3 adopted herein was aligned at a 508-μm pitch, so that the head was rotated so as to incline the direction of alignment of the nozzles 62.4° away from the direction parallel with the X-direction. The geometrical relation was illustrated in FIG. 3.

(Formation of Pattern)

A mold having a 25-nm-wide, 50-nm-deep, line-and-space (1:1) pattern, the surface of which given a mold releasing finish with a silane coupling agent (Optool DSX from Daikin Industries, Ltd.) having a perfluoropolyether structure, was placed on the silicon wafer having the photo-curable composition discharged thereon, the mold was pressed against the photo-curable composition under nitrogen gas flow at a pressure of 1 mPa, the photo-curable composition was then cured by irradiating light of a mercury lamp containing a 365 nm light, at a luminance of 10 mW/cm², and at an exposure energy of 200 mJ/cm², the mold was then slowly separated after the curing. The obtained pattern was observed under a scanning electron microscope, and evaluated with respect to (I) macro-pattern failure characterized by failure in pattern transfer over a 1-μm-diameter or larger range, and (II) micro-pattern omission characterized by chipping, falling, and separation of the pattern, according to the criteria below.

(I) Macro-pattern failure characterized by failure in pattern transfer over a 1-μm-diameter or larger range:
a: no mega-pattern failure observed;
b: macro-pattern failure slightly observed; and
c: macro-pattern failure frequently observed.

(II) Micro-pattern omission characterized by chipping, falling, and separation of the pattern:
A: no pattern omission observed;
B: pattern omission slightly observed; and
C: pattern omission frequently observed.

TABLE 3

| | Maintenance liquid | Curable composition | Macro pattern failure | Micro pattern Omission |
|---|---|---|---|---|
| Example 1 | X1 | Y1 | b | C |
| Example 2 | X2 | Y2 | b | B |
| Example 3 | X3 | Y3 | a | B |
| Example 4 | X4 | Y4 | a | B |
| Example 5 | X5 | Y3 | a | A |
| Example 6 | X6 | Y4 | a | A |
| Example 7 | X1 (50) X6 (50) | Y4 | a | A |
| Example 8 | M2 (48) M3 (48) M6 (2) | Y4 | a | A |
| Comparative Example 1 | X7 | Y1 | c | C |
| Comparative Example 2 | X8 | Y4 | c | C |

It was found that the level of the pattern formability is high when the ink-jet discharging device which was maintained with the maintenance liquid of the invention is used. It is extremely remarkable that the kind of the maintenance liquids influences with the imprintability.

The present disclosure relates to the subject matter contained in Japanese Patent Application No. 149850/2010 filed on Jun. 30, 2010 and in Japanese Patent Application No. 116598/2011 filed on May 25, 2011, which are expressly incorporated herein by reference in their entirety. All the publications referred to in the present specification are also expressly incorporated herein by reference in their entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

What is claimed is:

1. A method of manufacturing a maintenance liquid for an ink-jet device used for forming a pattern, the ink-jet device forming the pattern by discharging a photo-curable composition mainly composed of a polymerizable monomer onto a substrate or a mold having a fine pattern formed thereon, applying the other one of the substrate and the mold onto the photo-curable composition, and irradiating light onto the photo-curable composition held between the substrate and the mold having a fine pattern formed thereon, the method of manufacturing the maintenance liquid comprising:

mixing components for composing the maintenance liquid, followed by filtration of the mixed components of the maintenance liquid, wherein the maintenance liquid contains a compound having an ester group and/or an ether group, and a polymerizable monomer;

a ratio of area corresponded to polymerization products of the polymerizable monomer in the maintenance liquid is 0.5% or smaller relative to the polymerizable monomer, when measured by gel permeation chromatography (GPC) using a differential refractometer (RI detector); and at least one species of the polymerizable monomer contained in the maintenance liquid is a polymerizable monomer represented by the following formula:

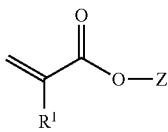

wherein R¹ is a hydrogen atom, an alkyl group, or a halogen group, and Z is a group having an aromatic group or a group having an alicyclic hydrocarbon group, wherein the polymerizable monomer is liquid at 25° C., and the viscosity thereof at 25° C. is 500 mPa·s or less.

2. The method of manufacturing a maintenance liquid according to claim 1, wherein the compound having an ester group and/or an ether group is a polymerizable monomer.

3. The method of manufacturing a maintenance liquid according to claim 1, wherein the maintenance liquid has a viscosity at 25° C. of 50 mPa·s or less.

4. The method of manufacturing a maintenance liquid according to claim 1, wherein the maintenance liquid contains a compound having both of an ester functional group and an ether group, or containing both of a compound having an ester functional group and a compound having an ether group.

5. The method of manufacturing a maintenance liquid according to claim 1, wherein the maintenance liquid has a boiling point at 1 atm of 150° C. or higher.

6. The method of manufacturing a maintenance liquid according to claim 1, wherein 50% by mass or more of the maintenance liquid is the compound having an ester group and/or an ether group.

7. The method of manufacturing a maintenance liquid according to claim 1, wherein the maintenance liquid consists essentially of the compound having an ester group and/or an ether group and the polymerizable monomer.

8. The method of manufacturing a maintenance liquid according to claim 1, wherein the maintenance liquid consists essentially of the compound having an ester group and/or an ether group and a (meth)acrylate monomer.

9. The method of manufacturing a maintenance liquid according to claim 1, wherein the compound having an ester group and/or an ether group is different from the polymerizable monomer.

10. The method of manufacturing a maintenance liquid according to claim 1, wherein the compound having an ester group and/or an ether group is non-polymerizable.

11. The method of manufacturing a maintenance liquid according to claim 1, wherein another species of the polymerizable monomer contained in the maintenance liquid is a polymerizable compound having at least either one of a fluorine atom and a silicon atom.

12. The method of manufacturing a maintenance liquid according to claim 1, wherein another species of the polymerizable monomer contained in the maintenance liquid is a polymerizable compound having at least two fluorine-containing groups selected from a fluoroalkyl group and a fluoroalkyl ether group in which at least two of the fluorine-containing groups are separated by a linking group having carbon atoms of 2 or more.

13. The method of manufacturing a maintenance liquid according to claim 1, wherein another species of the polymerizable monomer contained in the maintenance liquid is a polymerizable monomer represented by the following formula:

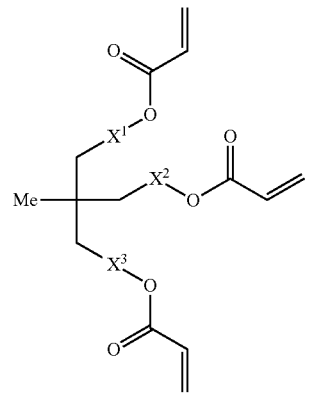

wherein X¹ to X³ each independently represents a single bond, or a linking group; and Me represents a methyl group.

14. A method of cleaning an ink-jet device used for forming a pattern, the ink-jet device forming the pattern by discharging a photo-curable composition mainly composed of a polymerizable monomer onto a substrate or a mold having a fine pattern formed thereon, applying the other one of the substrate and the mold onto the photo-curable composition, and irradiating light onto the photo-curable composition held between the substrate and the mold having a fine pattern formed thereon, the method of cleaning the device comprising:
    cleaning a component of the ink-jet device with a maintenance liquid,
    wherein the maintenance liquid contains a compound having an ester group and/or an ether group, and a polymerizable monomer;
    a ratio of area corresponded to polymerization products of the polymerizable monomer in the maintenance liquid is 0.5% or smaller relative to the polymerizable monomer, when measured by gel permeation chromatography (GPC) using a differential refractometer (RI detector); and
    at least one species of the polymerizable monomer contained in the maintenance liquid is a polymerizable monomer represented by the following formula:

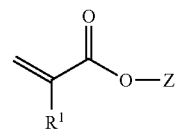

wherein R¹ is a hydrogen atom, an alkyl group, or a halogen group, and Z is a group having an aromatic group or a group having an alicyclic hydrocarbon group, wherein the polymerizable monomer is liquid at 25° C., and the viscosity thereof at 25° C. is 500 mPa·s or less.

15. The method of cleaning an ink-jet device according to claim 14, wherein the compound having an ester group and/or an ether group is a polymerizable monomer.

16. The method of cleaning an ink-jet device according to claim 14, wherein the maintenance liquid has a viscosity at 25° C. of 50 mPa·s or less.

17. The method of cleaning an ink-jet device according to claim 14, wherein the maintenance liquid contains a compound having both of an ester functional group and an ether group, or containing both of a compound having an ester functional group and a compound having an ether group.

18. The method of cleaning an ink-jet device according to claim 14, wherein the maintenance liquid has a boiling point at 1 atm of 150° C. or higher.

19. The method of cleaning an ink-jet device according to claim 14, wherein 50% by mass or more of the maintenance liquid is the compound having an ester group and/or an ether group.

20. The method of cleaning an ink-jet device according to claim 14, wherein the maintenance liquid consists essentially of the compound having an ester group and/or an ether group and the polymerizable monomer.

21. The method of cleaning an ink-jet device according to claim 14, wherein the maintenance liquid consists essentially of the compound having an ester group and/or an ether group and a (meth)acrylate monomer.

22. The method of cleaning an ink-jet device according to claim 14, wherein another species of the polymerizable monomer contained in the maintenance liquid is a polymerizable compound having at least either one of a fluorine atom and a silicon atom.

23. The method of cleaning an ink-jet device according to claim 14, wherein another species of the polymerizable monomer contained in the maintenance liquid is a polymerizable compound having at least two fluorine-containing groups selected from a fluoroalkyl group and a fluoroalkyl ether group in which at least two of the fluorine-containing groups are separated by a linking group having carbon atoms of 2 or more.

24. The method of cleaning an ink-jet device according to claim 14, wherein another species of the polymerizable monomer contained in the maintenance liquid is a polymerizable monomer represented by the following formula:

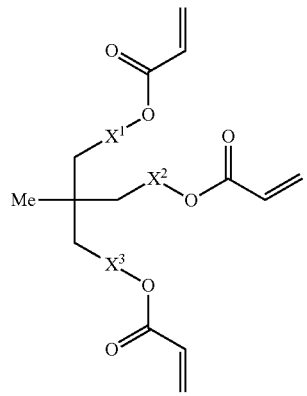

wherein $X^1$ to $X^3$ each independently represents a single bond, or a linking group; and Me represents a methyl group.

25. The method of cleaning an ink-jet device according to claim 14, wherein the component is a nozzle of the ink-jet device, and an ink-jetting head of the ink-jet device is brought down so that a surface of the nozzle is brought into contact with the maintenance liquid.

26. The method of cleaning an ink-jet device according to claim 14, wherein portions inside a head of the ink-jet device and in the vicinity of a nozzle of the inkjet device are cleaned by filling an inner space of the head of the ink-jet device with the maintenance liquid, then discharging the maintenance liquid out through the nozzle.

* * * * *